United States Patent
Li et al.

(10) Patent No.: US 10,321,575 B2
(45) Date of Patent: Jun. 11, 2019

(54) INTEGRATED CIRCUIT (IC) MODULE COMPRISING AN INTEGRATED CIRCUIT (IC) PACKAGE AND AN INTERPOSER WITH EMBEDDED PASSIVE COMPONENTS

(71) Applicant: QUALCOMM Incorporated, San Diego, CA (US)

(72) Inventors: Yue Li, San Diego, CA (US); Charles David Paynter, Encinitas, CA (US); Ryan David Lane, San Diego, CA (US); Ruey Kae Zang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 18 days.

(21) Appl. No.: 14/842,403

(22) Filed: Sep. 1, 2015

(65) Prior Publication Data

US 2017/0064837 A1    Mar. 2, 2017

(51) Int. Cl.
*H05K 1/18* (2006.01)
*H01L 21/56* (2006.01)
(Continued)

(52) U.S. Cl.
CPC ......... *H05K 1/186* (2013.01); *H01L 21/4857* (2013.01); *H01L 21/56* (2013.01); *H01L 23/49811* (2013.01); *H01L 23/49822* (2013.01); *H01L 23/49827* (2013.01); *H01L 23/64* (2013.01); *H05K 1/0306* (2013.01); *H05K 1/0313* (2013.01); *H05K 1/113* (2013.01);
(Continued)

(58) Field of Classification Search
CPC ........ H05K 1/186; H05K 1/113; H05K 1/114; H05K 1/0306; H05K 1/0313; H05K 2201/1003; H05K 2201/10015; H01L 21/56; H01L 23/49811
USPC .......................................... 361/761
See application file for complete search history.

(56) References Cited

U.S. PATENT DOCUMENTS 7,081,650 B2 *   7/2006   Palanduz ........... H01L 23/49822
                                                           257/310
7,339,798 B2 *   3/2008   Chakravorty ........... H01L 23/50
                                                          257/E23.079

(Continued)

OTHER PUBLICATIONS

International Search Report and Written Opinion—PCT/US2016/049774—ISA/EPO—dated Nov. 8, 2016.

*Primary Examiner* — Rockshana D Chowdhury
(74) *Attorney, Agent, or Firm* — Loza & Loza, LLP/Qualcomm

(57) ABSTRACT

An integrated circuit (IC) module that includes an integrated circuit (IC) package, a plurality of first solder interconnects coupled to the IC package, an interposer coupled to the IC package through the plurality of first solder interconnects a plurality of second solder interconnects coupled to the interposer; and a printed circuit board (PCB) coupled to the interposer through the plurality of second solder interconnects. The interposer includes an encapsulation layer, a first passive component at least partially embedded in the encapsulation layer, and a plurality of interconnects coupled to the first passive component. The encapsulation layer includes a mold and/or an epoxy fill. The first passive component is configured to operate as an electronic voltage regulator (EVR) for the IC module. In some implementations, the interposer is a fan out interposer.

26 Claims, 17 Drawing Sheets

(51) Int. Cl.
  *H01L 23/498* (2006.01)
  *H05K 1/03* (2006.01)
  *H05K 1/11* (2006.01)
  *H01L 23/64* (2006.01)
  *H01L 21/48* (2006.01)
  *H01L 23/13* (2006.01)
  *H01L 23/16* (2006.01)

(52) U.S. Cl.
  CPC ............. *H05K 1/114* (2013.01); *H01L 23/13* (2013.01); *H01L 23/16* (2013.01); *H01L 2224/131* (2013.01); *H01L 2224/16227* (2013.01); *H01L 2924/14* (2013.01); *H01L 2924/15311* (2013.01); *H01L 2924/19041* (2013.01); *H01L 2924/19042* (2013.01); *H01L 2924/19106* (2013.01); *H05K 2201/1003* (2013.01); *H05K 2201/10015* (2013.01)

(56) References Cited

U.S. PATENT DOCUMENTS

| | | | |
|---|---|---|---|
| 7,504,283 B2* | 3/2009 | Dunne | H01L 23/5389 438/107 |
| 7,952,194 B2 | 5/2011 | Nair et al. | |
| 8,139,368 B2* | 3/2012 | Nomura | H01L 23/3677 174/260 |
| 8,273,603 B2* | 9/2012 | Racz | B81C 1/00333 174/252 |
| 9,048,125 B2 | 6/2015 | Paek et al. | |
| 2008/0012154 A1 | 1/2008 | Chang | |
| 2010/0220448 A1 | 9/2010 | Nomura | |
| 2010/0230806 A1 | 9/2010 | Huang et al. | |
| 2011/0147917 A1 | 6/2011 | England et al. | |
| 2012/0286407 A1* | 11/2012 | Choi | H01L 21/4853 257/670 |
| 2013/0171752 A1* | 7/2013 | Val | H01L 22/14 438/15 |
| 2013/0201616 A1* | 8/2013 | Arnold | G06F 1/183 361/679.02 |
| 2014/0092576 A1* | 4/2014 | Lucero | H01L 25/167 361/783 |
| 2014/0106511 A1* | 4/2014 | Juskey | H01L 25/16 438/126 |
| 2014/0145300 A1* | 5/2014 | Bhagavat | H01L 29/66181 257/532 |
| 2014/0264789 A1 | 9/2014 | Yang et al. | |
| 2014/0283379 A1 | 9/2014 | Russell | |
| 2014/0367854 A1* | 12/2014 | Zhao | H01L 24/97 257/738 |
| 2015/0028463 A1 | 1/2015 | Ng | |
| 2015/0071333 A1 | 3/2015 | Zhou et al. | |
| 2015/0137338 A1 | 5/2015 | Lin et al. | |
| 2015/0206866 A1* | 7/2015 | Yu | H01L 25/18 257/738 |
| 2015/0237732 A1 | 8/2015 | Velez et al. | |

\* cited by examiner

PROFILE VIEW

PROFILE VIEW

PROFILE VIEW

PROFILE VIEW

PROFILE VIEW

PROFILE VIEW

PROFILE VIEW

PROFILE VIEW

PLAN VIEW

PLAN VIEW

INTEGRATED CIRCUIT (IC) MODULE COMPRISING AN INTEGRATED CIRCUIT (IC) PACKAGE AND AN INTERPOSER WITH EMBEDDED PASSIVE COMPONENTS

BACKGROUND

Field of the Disclosure

Various features relate generally to an integrated circuit (IC) module, and more specifically to an IC module that includes an IC package coupled to an interposer that includes a passive component.

Background

FIG. 1 illustrates an integrated circuit (IC) module 100 that includes an integrated circuit (IC) package 101 and a printed circuit board (PCB) 104. The integrated circuit (IC) package 101 is coupled to the printed circuit board (PCB) 104. The IC package 101 includes a die 110, a package substrate 112, an encapsulation layer 114, and a first plurality of solder balls 116. The die 110 is coupled to the package substrate 112 through the first plurality of solder balls 116. The encapsulation layer 114 encapsulates the die 110. The IC package 101 is coupled to the PCB 104 through a second plurality of solder balls 118.

FIG. 1 further illustrates a plurality of passive components mounted on the PCB 104. More specifically, a first component 120 and a second component 122 are mounted on the PCB 104. The first component 120 may be a first passive component (e.g., capacitor). The second component may be a second passive component (e.g., inductor).

FIG. 1 illustrates that the first component 120 and the second component 122 take up a lot of real estate on the PCB 104, which is not ideal, as there is an ongoing need to reduce the overall size of devices, modules and packages. It may be possible to position the first component 120 and the second component 122 underneath the IC package 101. However, such an approach has at least two drawbacks. First, it may increase the overall height of the device and module that includes the IC package 101, which is not desirable. Second, it may require the de-population of one or more solder balls from the first plurality of solder balls. The first plurality of solder balls provides a plurality of electrical paths between the IC package 101 and the PCB 104, and also provides structural support for the IC package 101. When one or more of the solder balls is removed, one or more of the electrical paths is removed, which may require a complete redesign of the circuit of the IC package 101, which is very expensive. Moreover, removing one or more solder balls also compromises the structural stability of the IC package 101.

There is an ongoing industry trend to reduce the size of modules and that include passive components, as these modules and packages are placed in smaller and smaller devices. Ideally, such a module and package will have a better form factor, be cheaper to fabricate, while at the same time meeting the needs and/or requirements of mobile and/or wearable devices.

SUMMARY

Various features relate generally to an integrated circuit (IC) module, and more specifically to an IC module that includes an IC package coupled to an interposer that includes a passive component.

One example provides an interposer that includes an encapsulation layer, a passive component at least partially embedded in the encapsulation layer, and a plurality of interconnects coupled to the passive component.

Another example provides an integrated circuit (IC) module that includes an integrated circuit (IC) package, a plurality of first solder interconnects coupled to the IC package, an interposer coupled to the IC package through the plurality of first solder interconnects, a plurality of second solder interconnects coupled to the interposer, and a printed circuit board (PGB) coupled to the interposer through the plurality of second solder interconnects. The interposer includes an encapsulation layer, a passive component at least partially embedded in the encapsulation layer, and a plurality of interconnects coupled to the passive component.

Another example provides a method for fabricating an integrated circuit (IC) module. The method provides an interposer, where providing the interposer includes providing at least one passive component, forming an encapsulation layer over the at least one passive component, and forming a plurality of interconnects in the encapsulation layer. The method provides an integrated circuit (IC) package. The method couples the IC package to the interposer by using a plurality of first solder interconnects. The method provides a printed circuit board (PCB). The method couples the PCB to the interposer by using a plurality of second solder interconnects.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Some features pertain to an integrated circuit (IC) module that includes an integrated circuit (IC) package, a plurality of first solder interconnects coupled to the IC package, an interposer coupled to the IC package through the plurality of first solder interconnects, a plurality of second solder interconnects coupled to the interposer, and a printed circuit board (PCB) coupled to the interposer through the plurality of second solder interconnects. The interposer includes an encapsulation layer, a first passive component at least partially embedded in the encapsulation layer, and a plurality of interconnects coupled to the first passive component. The encapsulation layer includes a mold and/or an epoxy fill. The first passive component is configured to operate as part of an electronic voltage regulator (FAIR) for the IC module. In some implementations, the interposer is a fan out interposer.

Figure 2:
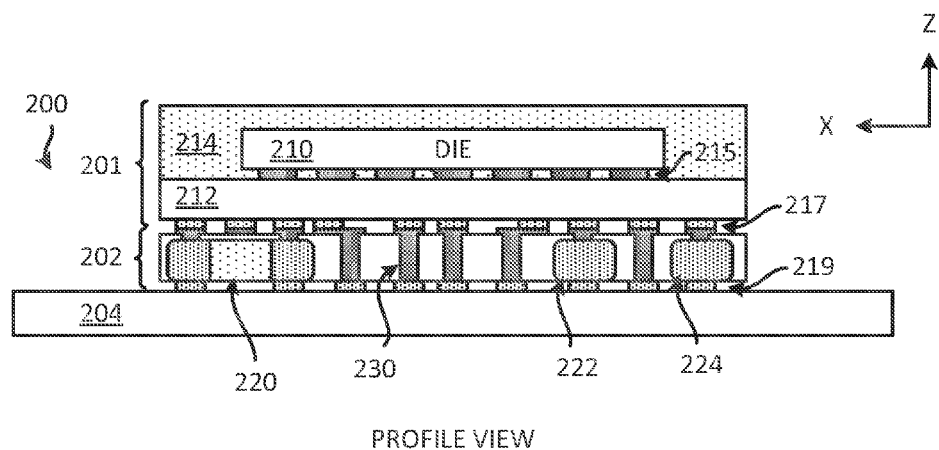
FIG. 2 illustrates a cross-sectional profile view of an integrated circuit (IC) package and an interposer comprising passive components mounted on a printed circuit board (PCB).

Exemplary Integrated Circuit (IC) Module Comprising an Integrated Circuit (IC) Package and an Interposer Comprising a Plurality of Passive Components FIG. 2 illustrates an integrated circuit (IC) module 200 that includes an integrated circuit (IC) package 201, an interposer 202, and a printed circuit board (PCB) 204. The IC package 201 includes a die 210 (e.g., a bare die), a package substrate 212, an encapsulation layer 214, and a plurality of solder interconnects 215 (e.g., solder balls). The die 210 is coupled to the package substrate 212 through the plurality of solder interconnects 215. The encapsulation layer 214 at least partially encapsulates the die 210. The package substrate 212 includes a plurality of interconnects (not shown).

The IC package 201 is coupled to the interposer 202 through a plurality of first solder interconnects 217 (e.g., solder balls). The interposer 202 is coupled (e.g., mounted over) the PCB 204 through a plurality of second solder interconnects 219 (e.g., solder balls). As shown in FIG. 2, the interposer 202, is located between the IC package 201 and the PCB 204.

The interposer 202 includes a plurality of passive components. More specifically, the interposer 202 includes a first passive component 220, a second passive component 222, and a third passive component 224. Examples of passive components include an inductor and a capacitor. In some implementations, the first passive component 220, the second passive component 222 and/or the third passive component 224 are configured to operate as part of an electronic voltage regulator (EVR) in the IC module 200. The interposer 202 also includes a plurality of interconnects 230 (e.g., vias, traces, pads). Some interconnects from the plurality of interconnects 230 may be coupled to one or more of the passive components (e.g., first passive component 220, second passive component 222). A passive component may be a discrete or an off the shelf passive component that uses a separate or different fabrication process than the fabrication process used to fabricate an interposer (e.g., interposer 202).

In some implementations, an interconnect is an element or component of a device, a module, a package, and/or an interposer that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may configured to provide an electrical path for a signal (e.g., data signal, ground signal, power signal). An interconnect may be part of a circuit. An interconnect may include more than one element or component. For example, an interconnect may comprise one or more interconnects.

Figure 1:
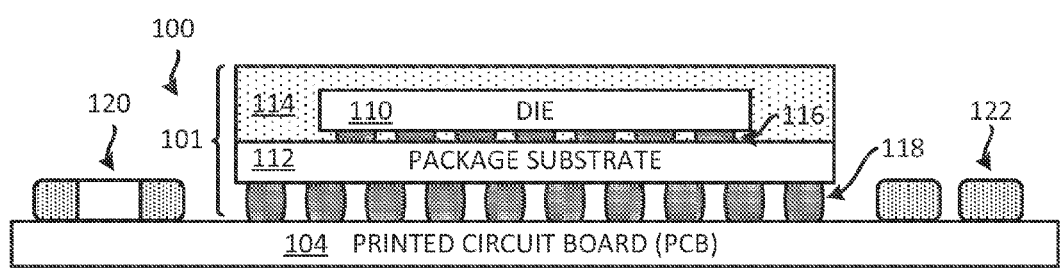
FIG. 1 illustrates a cross-sectional profile view of an integrated circuit (IC) package and passive components mounted on a printed circuit board (PCB).

There are several advantages of embedding or placing passive components in the interposer 202. First, it reduces the overall real estate or foot print of the IC module 200. A comparison of the IC module 200 to the IC module 100 of FIG. 1 shows that the IC module 200 takes up less space (in the lateral X-Y plane) than the IC module 100. Second, the overall structural stability and/or strength of the IC package 201 is preserved by using the interposer 202 that include the passive components. This is because, the plurality of first solder interconnects 217 does not need to be depopulated to accommodate the interposer 202. However, it should be noted that some solder interconnects may be de-populated for other reasons. Third, the IC package 201 does not need to be redesigned to accommodate the interposer 202 with the passive components. As mentioned above in FIG. 1, in order to place a passive component between the IC package 101 and the PCB 104, the de-population of some of the solder interconnects from the plurality of solder interconnects 118 may be required. The de-population of the solder interconnects causes a loss of at least one electrical path. Thus, the circuit of the IC package 101 may need to be redesigned to take into account the loss of an electrical path. However, in the case of the IC module 200, the IC package 201 does not need to be completely redesigned because there is no need to de-populate the plurality of first solder interconnects 217. Instead, the interposer 202 can be designed around the IC package 201. Fourth, the use of the interposer 202 may provide better pitch, spacing and density interconnects between the IC package 201 and the PCB 204 without increasing the overall height and/or size of the IC module 200. Fifth, keeping and/or preserving the number of solder interconnects between the IC package 201 and the interposer 202 helps maintain the number of thermal paths out of the IC package 201, thus providing better heat dissipation for the IC package 201. When one or more solder interconnects are removed between the IC package 201 and the interposer 202, there is less heat dissipation capability for the IC package 201. Thus, it may be thermally advantageous to keep as many thermal paths between the IC package 201 and the interposer 202.

Having described the several advantages of an interposer comprising embedded passive components, the interposer 202 will now be further described below in detail in FIG. 3.

Figure 3:
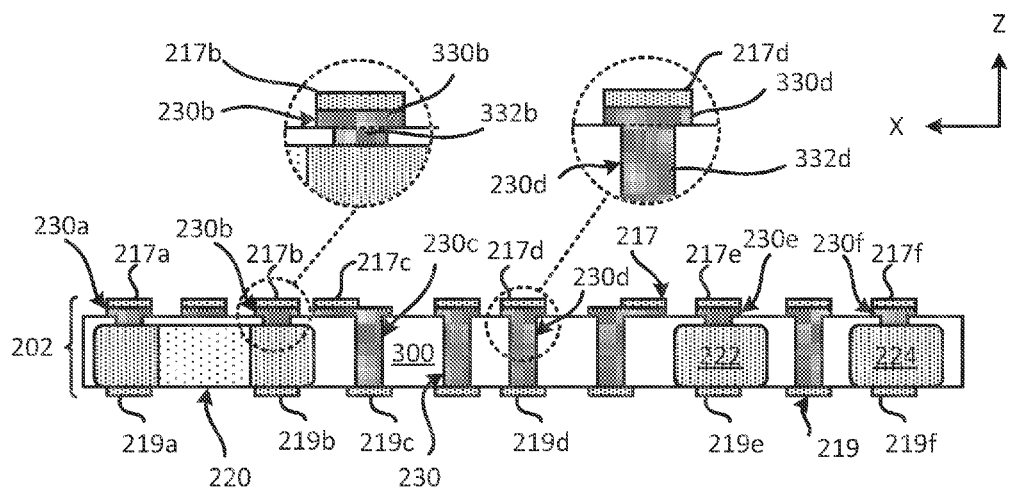
FIG. 3 illustrates a cross-sectional profile view of an interposer comprising passive components.

FIG. 3 illustrates a cross-sectional profile view of the interposer 202 that includes a plurality of passive components. The interposer 202 includes an encapsulation layer 300, the first passive component 220, the second passive component 222, the third passive component 224, and the plurality of interconnects 230 (e.g., interconnects 230a-230f). The plurality of interconnects 230 may include vias, traces, and/or pads. The encapsulation layer 300 may comprise E-glass, low coefficient of thermal expansion (CTE) glass, a mold and/or epoxy fill. The encapsulation layer 300 includes a material that is structurally more rigid and/or strong than a dielectric layer (e.g., dielectric layer in the die 210, dielectric layer in the package substrate 212). In some implementations, the encapsulation layer 300 includes a higher concentration of a fill material (e.g., epoxy fill) than a dielectric layer (e.g., core material, prepeg material). The encapsulation layer 300 is configured to provide mechanical and structural support for the interposer 202. In addition to providing mechanical and structural support, the encapsulation layer 300 may also be configured to electrically isolate signals that traverse interconnects in/on the encapsulation layer 300.

FIG. 3 illustrates that a first surface of the first passive component 220 (e.g., a majority or substantial portion of the first surface of the first passive component 220) is substantially co-planar with a first surface (e.g., bottom surface) of the encapsulation layer 300. Similarly, a first surface of the second passive component 222 (e.g., a majority or substantial portion of the first surface of the second passive component 222) is substantially co-planar with the first surface (e.g., bottom surface) of the encapsulation layer 300, and a first surface of the third passive component 224 (e.g., a majority or substantial portion of the first surface of the third passive component 224) is substantially co-planar with the first surface (e.g., bottom surface) of the encapsulation layer 300. In some implementations, a second surface of the first passive component 220, a second surface of the second passive component 222, and/or a second surface of the third passive component 224 may be substantially co-planar with a second surface of the encapsulation layer 300. In some implementations, substantially co-planar surfaces are defined as surfaces that are within a height of about 5 microns (μm) or less, of each other. One advantage of having a surface of a passive component (e.g., first passive component 220) that is substantially co-planar with a surface of an encapsulation layer (e.g., encapsulation layer 300), is that it helps minimizes the height and thickness of the interposer (e.g., interposer 202), thereby providing an IC module that has a lower height.

The encapsulation layer 300 at least partially encapsulates the first passive component 220, the second passive component 222, and the third passive component 224. In some implementations, portions of the first passive component 220, the second passive component 222, and/or the third passive component 224 may not be encapsulated by the encapsulation layer 300. In some implementations, the first passive component 220, the second passive component 222, and the third passive component 224 are embedded or positioned in the encapsulation layer 300 such that the first passive component 220, the second passive component 222, and/or the third passive component 224 is offset from a center plane that lateral traverses the encapsulation layer 300 (e.g., center plane that traverses along the X-direction). In FIG. 3, the first passive component 220, the second passive component 222, the third passive component 224 are closer to the bottom surface (e.g., first surface) than the top surface (e.g., second surface) of the encapsulation layer 300. It is noted that the offset of the passive components is optional. In some implementations, the passive components may be centered in the encapsulation layer 300, or offset in a different direction in the encapsulation layer 300.

FIG. 3 illustrates that a portion of the first passive component 220, a portion of the second passive component 222, and a portion of the third passive component 224 are free from encapsulation from the encapsulation layer 300.

In some implementations, the encapsulation layer 300 may be a litho-patternable layer. A litho-patternable layer/material that is a material that is photo etchable. That is, the litho-patternable layer/material is made of a material that can be etched and/or removed (e.g., through a lithography process) through the exposure of the material to a light source (e.g., ultraviolet (UV) light) through a mask (e.g., photomask). One advantage of litho-patternable layer/material is that interconnects with lower pitch and/or spacing may be formed in the litho-patternable layer/material. The use of a photo lithography process to form cavities in the encapsulation layer forms cavities with pitch and/or spacing that can be smaller than the pitch and/or spacing of the cavities formed by a laser process (e.g., laser ablation). Thus, a process that includes a photo lithography process may form interconnects with pitch and/or spacing in the encapsulation layer that may be smaller than the pitch and/or spacing of interconnects formed by a process that includes a laser process (e.g., laser ablation).

The interposer 202 includes a plurality of interconnects 230 (e.g., interconnects 230a-230f). The interconnect 230a is coupled to the first passive component 220 (e.g., a first terminal of the first passive component 220). The interconnect 230b is coupled to the first passive component 220 (e.g., a second terminal of the first passive component 220). The interconnect 230b includes the interconnect 330b (e.g., pad) and the interconnect 332b (e.g., via). The interconnect 230c traverses the interposer 202, and more specifically the encapsulation layer 300. The interconnect 230d traverses the interposer 202, and more specifically the encapsulation layer 300. The interconnect 230d includes the interconnect 330d (e.g., pad) and the interconnect 332d (e.g., via). The interconnect 230e is coupled to the second passive component 222. The interconnect 230f is coupled to the third passive component 224. As mentioned above, an interconnect may include a via, a trace, a pad or a combination thereof.

FIG. 3 illustrates that the interposer 202 optionally includes the plurality of first solder interconnects 217 (e.g., solder interconnects 217a-217f) and the plurality of second solder interconnects 219 (e.g., solder interconnects 219a-219f). The plurality of first solder interconnects 217 and the plurality of second solder interconnects 219 may be printed solder that is formed on interconnects of the interposer 202, and/or the passive components.

The solder interconnect 217a is coupled to the interconnect 230a. The solder interconnect 217b is coupled to the interconnect 230b. More specifically, the solder interconnect 217b is coupled to the interconnect 330b. The solder interconnect 217c is coupled to the interconnect 230c. The solder interconnect 217d is coupled to the interconnect 230d. More specifically, the solder interconnect 217d is coupled to the interconnect 330d. The solder interconnect 217e is coupled to the interconnect 230e. The solder interconnect 217f is coupled to the interconnect 230f.

The solder interconnect 219a is coupled to the first passive component 220 (e.g., third terminal of the first passive component 220). The solder interconnect 219b is coupled to the first passive component 220 (e.g., fourth terminal of the first passive component 220). The solder interconnect 219c is coupled to the interconnect 230c. The solder interconnect 219d is coupled to the interconnect 230d. More specifically, the solder interconnect 219b is coupled to the interconnect 332d. The solder interconnect 219e is coupled to the second passive component 222. The solder interconnect 219f is coupled to the third passive component 224.

Different implementations may provide the interposer 202 with different sizes, shapes and interconnect densities. Table 1 below illustrates examples of possible physical properties and dimensions of the interposer 202 or any of the interposers described in the present disclosure. In some implementations, the ball pitch, the ball diameter, and the ball height of Table 1 may refer to the plurality of first solder interconnects 217 and/or the plurality of second solder interconnects 219.

The interposer 402 also include the plurality of interconnects 430 (interconnects 430a-430f). The plurality of interconnects 430 may include vias, traces and/or pads. The interconnect 430a (e.g., pad) is coupled to the first passive component 220 (e.g., third terminal of the first passive component 220). The interconnect 430b (e.g., pad) is coupled to the first passive component 220 (e.g., fourth terminal of the first passive component 220). The interconnect 430b is also coupled to the solder interconnect 219b. The interconnect 430d is coupled to the interconnect 230d. More specifically, the interconnect 430d is coupled to the interconnect 332d. The interconnect 430d is also coupled to the solder interconnect 219d. The interconnect 430e is coupled to the second passive component 222. The interconnect 430e is also coupled to the solder interconnect 219e. The interconnect 430f is coupled to the third passive component 224. The interconnect 430e is also coupled to the solder interconnect 219e. As mentioned above, an interconnect may include a via, a trace, a pad or a combination thereof.

Figure 6:
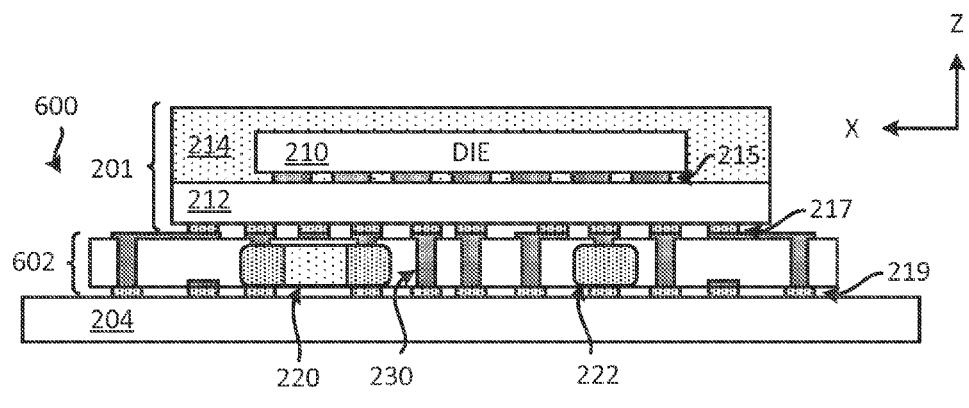
FIG. 6 illustrates a cross-sectional profile view of an integrated circuit (IC) package and another interposer comprising passive components mounted on a printed circuit board (PCB).

Exemplary Integrated Circuit (IC) Module Comprising an Integrated Circuit (IC) Package and an Interposer Comprising a Plurality of Passive Components FIG. 6 illustrates another integrated circuit (IC) module 600 that includes the integrated circuit (IC) package 201, an interposer 602 and the printed circuit board (PCB) 204. The IC module 600 of FIG. 6 is similar to the IC module 200 of FIG. 2, except that the IC module 600 includes an interposer 602 with a different design than the interposer 202 of FIG. 2. In some implementations, the interposer 602 is a fan out interposer.

TABLE 1

Dimensions of Interposer

| CASE | Ball Pitch (μm) | Ball Diam (μm) | Ball Height after Reflow (μm) | Interposer Thickness (μm) | Solder Paste Thickness (μm) | Max. Thickness of Embedded Passive Components (μm) |
|---|---|---|---|---|---|---|
| 1 | 350 | 230 ± 30 | 180 ± 20 | 150 ± 20 | 10 ± 5 | <100 |
| 2 | 400 | 250 ± 30 | 200 ± 20 | 160 ± 20 | 20 ± 5 | 110 |
| 3 | 500 | 300 ± 30 | 250 ± 20 | 200 ± 20 | 20 ± 5 | 150 |
| 4 | 650 | 350 ± 30 | 300 ± 20 | 250 ± 20 | 20 ± 5 | 150 |

Figure 4:
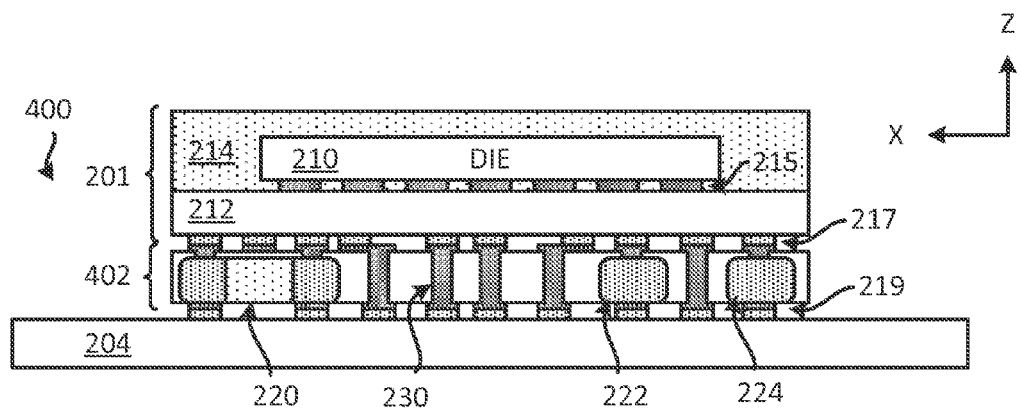
FIG. 4 illustrates a cross-sectional profile view of an integrated circuit (IC) package and another interposer comprising passive components mounted on a printed circuit board (PCB).

Exemplary Integrated Circuit (IC) Module Comprising an Integrated Circuit (IC) Package and an Interposer Comprising a Plurality of Passive Components FIG. 4 illustrates another integrated circuit (IC) module 400 that includes the integrated circuit (IC) package 201, an interposer 402 and the printed circuit board (PCB) 204. The IC module 400 of FIG. 4 is similar to the IC module 200 of FIG. 2, except that the IC module 400 includes an interposer 402 with a different design than the interposer 202 of FIG. 2.

The IC package 201 is coupled to the interposer 402 through the plurality of first solder interconnects 217 (e.g., solder balls). The interposer 402 is coupled (e.g., mounted over) the PCB 204 through the plurality of second solder interconnects 219 (e.g., solder balls). As shown in FIG. 4, the interposer 402 is located between the IC package 201 and the PCB 204. The differences between the interposer 402 and the interposer 202 is further illustrated and described in FIG. 5.

Figure 5:
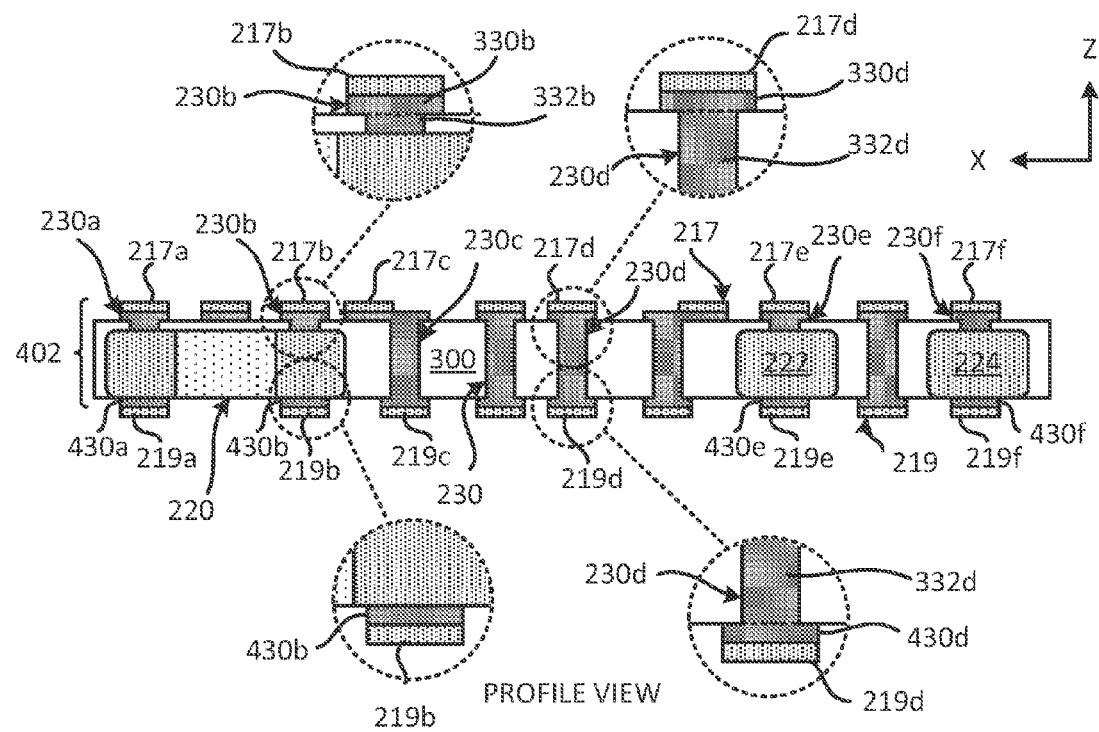
FIG. 5 illustrates a cross-sectional profile view of an interposer comprising passive components.

FIG. 5 illustrates a cross-sectional profile view of the interposer 402 that includes a plurality of passive components. The interposer 402 includes an encapsulation layer 300, the first passive component 220, the second passive component 222, the third passive component 224, and the plurality of interconnects 230 (e.g., interconnects 230a-230f). The plurality of interconnects 230 may include vias, traces, and/or pads.

The IC package 201 is coupled to the interposer 602 through the plurality of first solder interconnects 217 (e.g., solder balls). The interposer 602 is coupled (e.g., mounted over) the PCB 204 through the plurality of second solder interconnects 219 (e.g., solder balls). As shown in FIG. 6, the interposer 602 is located between the IC package 201 and the PCB 204. The interposer 602 is slightly larger (e.g., larger foot print or surface area) than the interposer 202. The larger surface area of the interposer 602 may allow for better interconnect connections. For example, the larger surface area may allow for a redistribution portion (e.g., a fan out portion) for fanning or routing of signaling to and from devices with different I/O pitches. A redistribution portion may redistribute signaling from I/O pads of a die or package to other locations of the module.

One portion of the interposer 602 may include interconnects with a first density property (e.g., pitch, spacing), while a second portion of the interposer 602 may include interconnects with a second density property (e.g., pitch, spacing) that is different than the first density property. An example of different interconnect density properties are further described in FIG. 10. The differences between the interposer 602 and the interposer 202 is further illustrated and described in FIG. 7.

Figure 7:
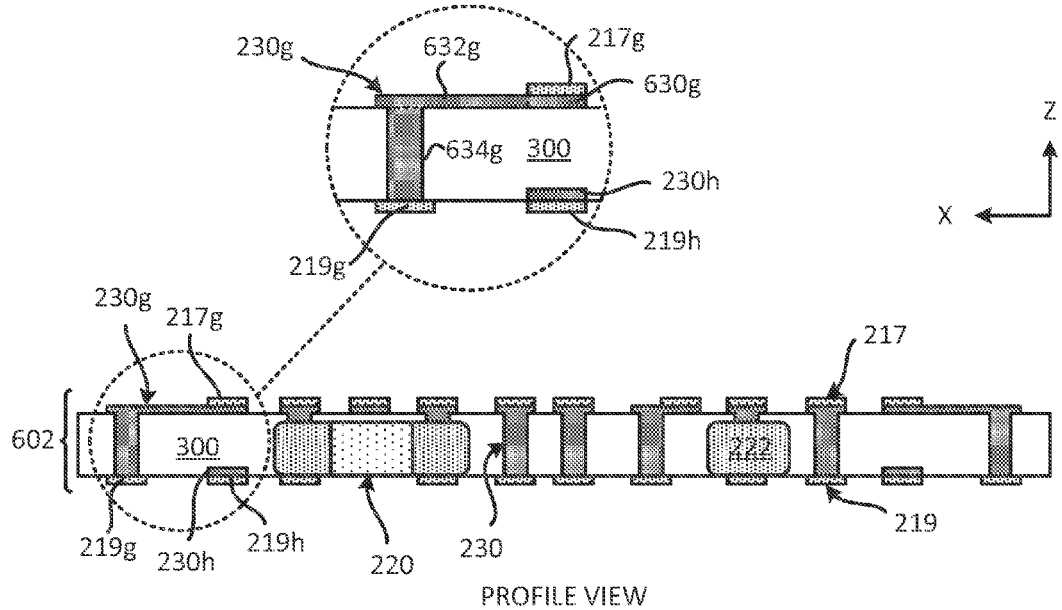
FIG. 7 illustrates a cross-sectional profile view of another interposer comprising passive components.

FIG. 7 illustrates a cross-sectional profile view of the interposer 602 that includes a plurality of passive components. The interposer 602 includes an encapsulation layer 300, the first passive component 220, the second passive component 222, the third passive component 224, and the plurality of interconnects 230 (e.g., interconnects 230g-230h). The first passive component 220, the second passive component 222, and/or the third passive component 224 are coupled to the plurality of interconnects 230 in a manner similar as described in FIG. 3.

The plurality of interconnects 230 may include vias, traces, and/or pads. The interconnect 230g includes the interconnect 630g (e.g., pad), the interconnect 632g (e.g., trace), and the interconnect 634g (e.g., via). The interconnect 230g may be a redistribution interconnect that redistributes signaling from the IC package 201 to other locations or components of the IC module 600. The interconnect 630g is coupled to the solder interconnect 217g. The interconnect 634g is coupled to the solder interconnect 219g. The interconnect 230h is coupled to the solder interconnect 219h. As mentioned above, an interconnect may include a via, a trace, a pad or a combination thereof.

Figure 8:
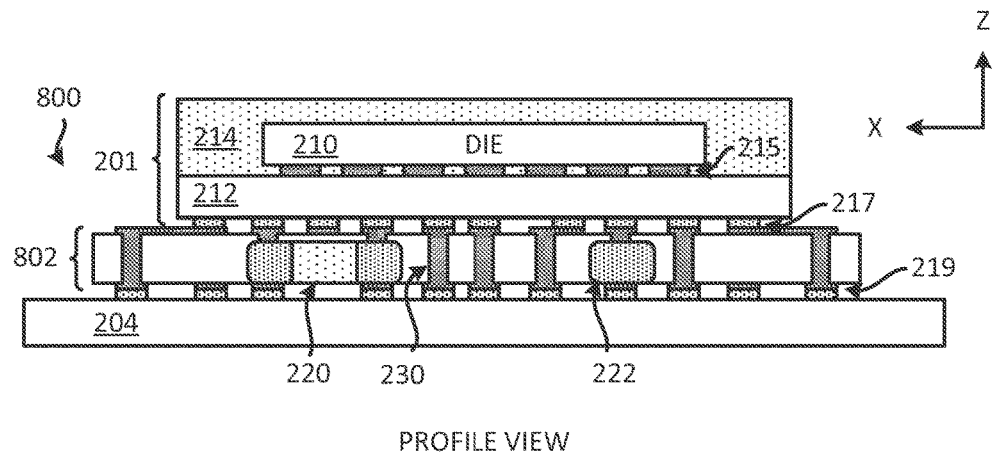
FIG. 8 illustrates a cross-sectional profile view of an integrated circuit (IC) package and an interposer comprising passive components mounted on a printed circuit board (PCB).

Exemplary Integrated Circuit (IC) Module Comprising an Integrated Circuit (IC) Package and an Interposer Comprising a Plurality of Passive Components FIG. 8 illustrates another integrated circuit (IC) module 800 that includes the integrated circuit (IC) package 201, an interposer 802 and the printed circuit board (PCB) 204. The IC module 800 of FIG. 8 is similar to the IC module 600 of FIG. 6, except that the IC module 800 includes an interposer 802 with a different design than the interposer 602 of FIG. 6. In some implementations, the interposer 802 is a fan out interposer.

The IC package 201 is coupled to the interposer 802 through the plurality of first solder interconnects 217 (e.g., solder balls). The interposer 802 is coupled (e.g., mounted over) the PCB 204 through the plurality of second solder interconnects 219 (e.g., solder balls). As shown in FIG. 8, the interposer 802 is located between the IC package 201 and the PCB 204. The differences between the interposer 802 and the interposer 602 is further illustrated and described in FIG. 9.

Figure 9:
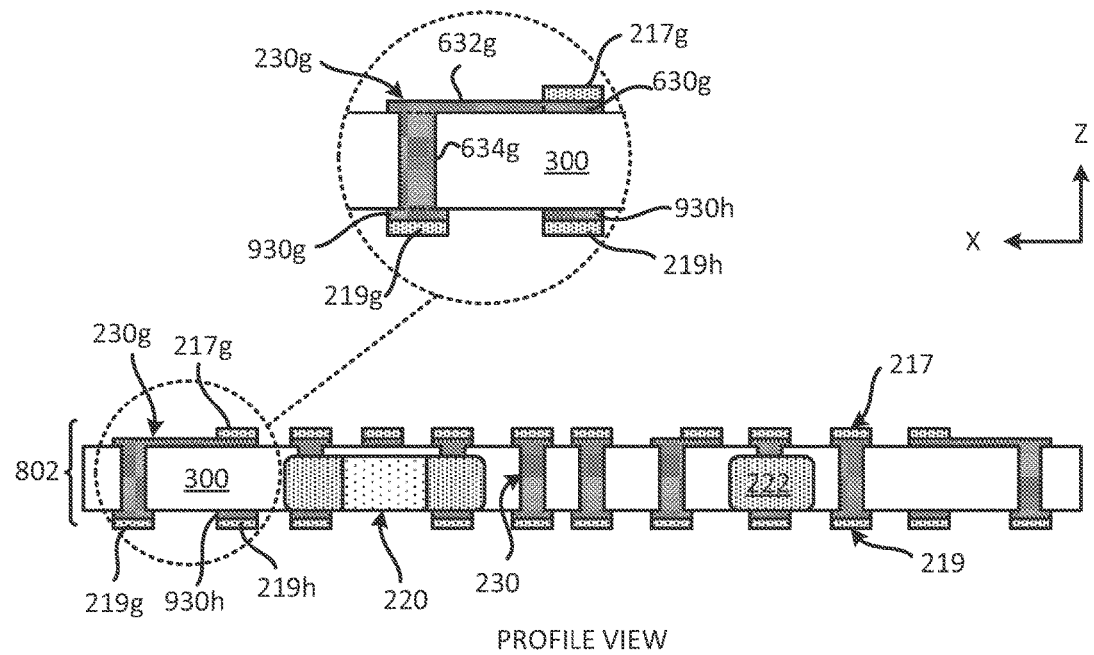
FIG. 9 illustrates a cross-sectional profile view of another interposer comprising passive components.

FIG. 9 illustrates a cross-sectional profile view of the interposer 802 that includes a plurality of passive components. The interposer 802 includes an encapsulation layer 300, the first passive component 220, the second passive component 222, the third passive component 224, and the plurality of interconnects 230 (e.g., interconnects 230g-230h). The first passive component 220, the second passive component 222, and/or the third passive component 224 are coupled to the plurality of interconnects 230 in a manner similar as described in FIG. 3.

The plurality of interconnects 230 may include vias, traces, and/or pads. The interconnect 230g includes the interconnect 630g (e.g., pad), the interconnect 632g (e.g., trace), the interconnect 634g (e.g., via), and the interconnect 930g. The interconnect 230g may be a redistribution interconnect that redistributes signaling from the IC package 201 to other locations or components of the IC module 800. The interconnect 630g is coupled to the solder interconnect 217g. The interconnect 930g is coupled to the solder interconnect 219g. The interconnect 930h is coupled to the solder interconnect 219h. As mentioned above, an interconnect may include a via, a trace, a pad or a combination thereof.

It is noted that an interconnect comprising a trace and/or pad can be formed on the top surface, the bottom surface, or both, of the encapsulation layer 300. In some implementations, some interconnects from the plurality of interconnects 230 and/or some interconnects from the plurality of interconnects 430, may be configured to operate as an inductor (e.g., built-in inductor). An example of a built-in inductor in an interposer is further illustrated and described below in FIGS. 17-18.

Exemplary Fan Out Interposer Comprising a Plurality of Passive Components

As mentioned above, in some implementations, an interposer comprising embedded passive components may be a fan out interposer. For example, the interposer 602 and the interposer 802 may be a fan out interposer.

A fan out interposer includes a redistribution portion (e.g., a fan out portion) for fanning or routing of signaling to and from devices with different I/O pitches. A redistribution portion may redistribute signaling from I/O pads of a die or package to other locations or components of an integrated circuit (IC) module.

Figure 10:
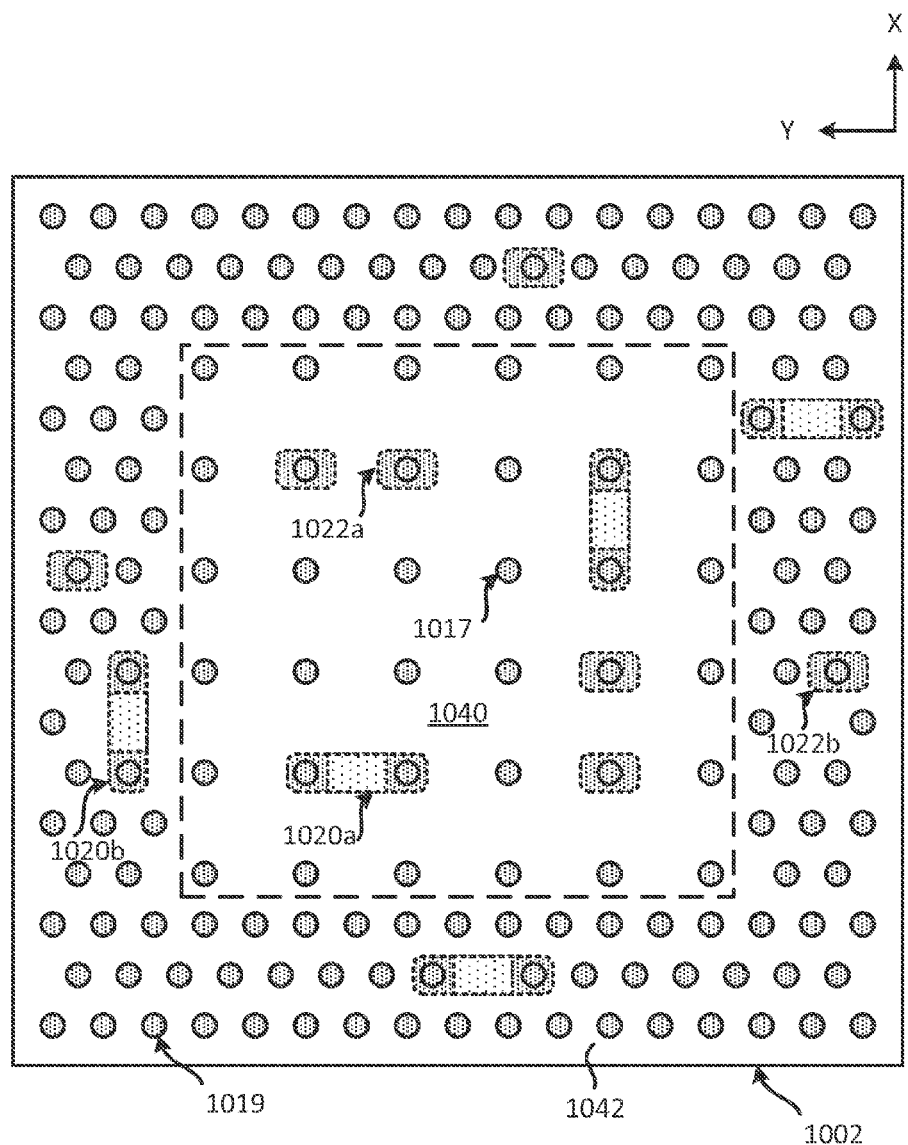
FIG. 10 illustrates a plan view of an interposer comprising passive components.

FIG. 10 illustrates a plan view (e.g., top view) of an interposer 1002. The interposer 1002 includes a first portion 1040 and a second portion 1042. A plurality of first solder interconnects 1017 (e.g., solder balls) is coupled to the interposer 1002. A plurality of second solder interconnects 1019 (e.g., solder balls) is coupled to the interposer 1002. For the purpose of clarity, interconnects such as vias, traces, and pads are not shown in the interposer 1002 of FIG. 10. The interposer 1002 may correspond to any of the interposers described in the present disclosure.

FIG. 10 illustrates that the plurality of first solder interconnects 1017 are coupled to the first portion 1040 of the interposer 1002, and the plurality of second solder interconnects 1019 are coupled to the second portion 1042. The first portion 1040 is a portion of the interposer 1002 that includes low density solder interconnects. The second portion 1042 is a portion of the interposer 1002 that includes high density solder interconnects. That is, the pitch and/or spacing of the solder interconnects from the plurality of first solder interconnects 1017 is greater than the pitch and/or spacing of the solder interconnects from the plurality of second solder interconnects 1019. In some implementations, the plurality of first solder interconnects 1017 are solder interconnects that are coupled to an integrated circuit (IC) package (e.g., IC package 201), while the plurality of second solder interconnects 1019 are solder interconnects that are coupled to a printed circuit board (PCB) (e.g., PCB 204). In some implementations, the second portion 1042 of the interposer 1002 is the fan out portion of the interposer 1002.

In some implementations, the first portion 1040 includes a plurality of first interconnects (not shown) that includes a first minimum pitch, and the second portion 1042 includes a plurality of second interconnects (not shown) that includes a second minimum pitch. In some implementations, the second minimum pitch is less than the first minimum pitch. The second portion 1042 is a perimeter portion of the interposer 1002.

FIG. 10 also illustrates several passive components 1020 and 1022 (e.g., passive component 1020a, passive component 1022a). These passive components 1020 and 1022 may be embedded or positioned in various portions of the interposer 1002. For example, the passive component 1020a and the passive component 1022a are located in the first portion 1040, while the passive component 1020b and the passive component 1022b are located in the second portion 1042.

Figure 11A:
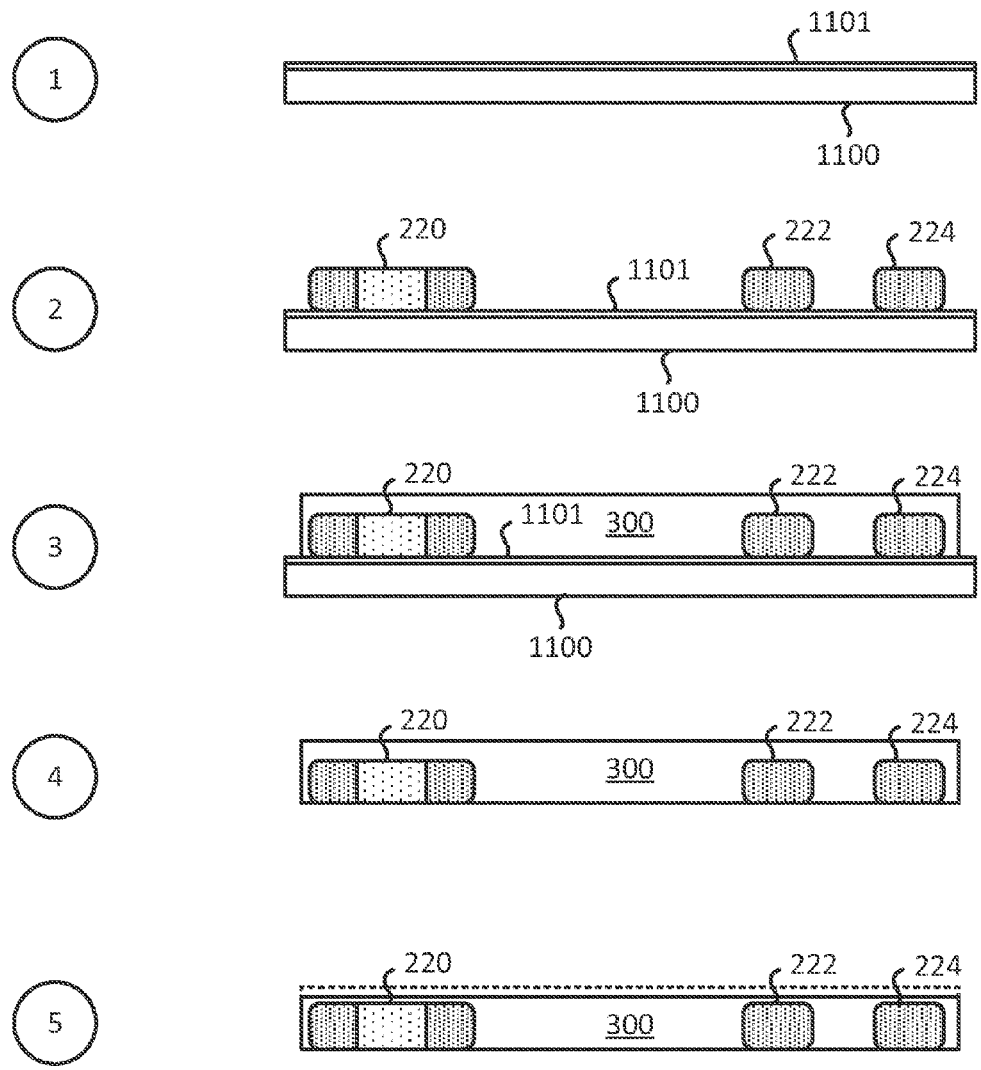
FIG. 11 (which comprises FIGS. 11A-11B) illustrates an example of a sequence for fabricating an interposer comprising passive components.
Figure 11B:
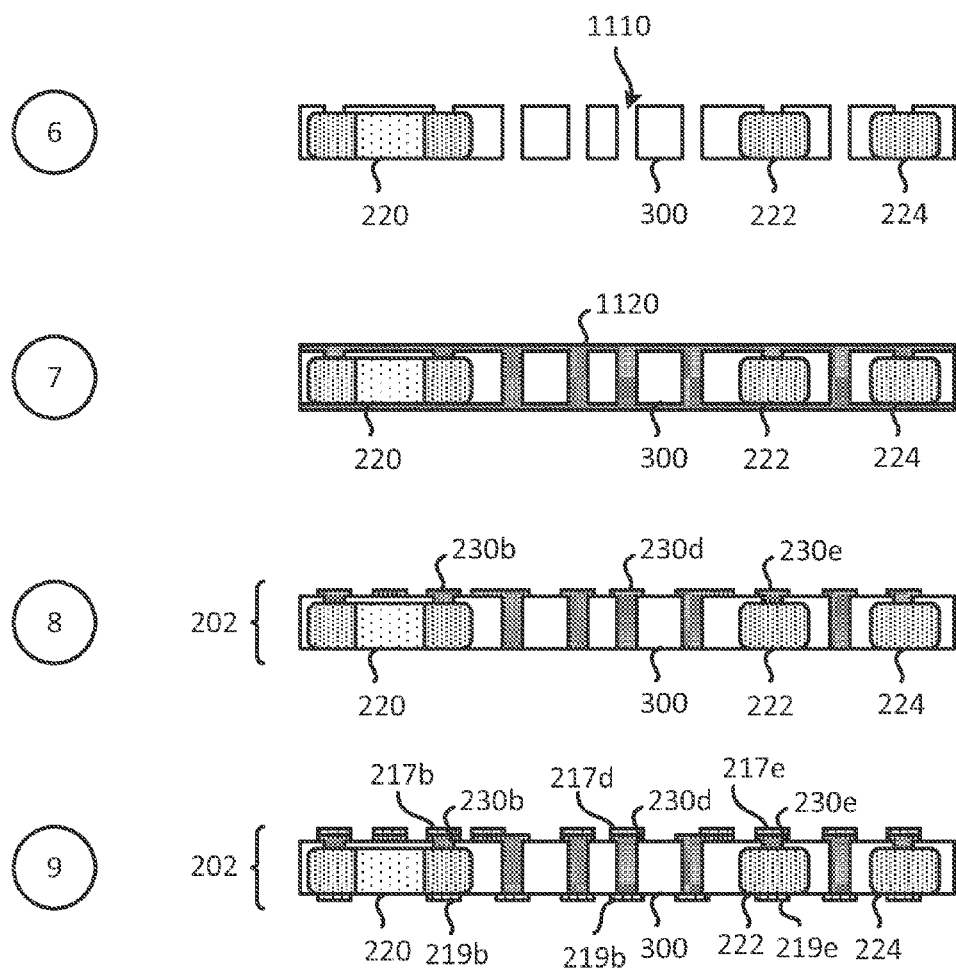

Exemplary Sequence for Fabricating an Interposer Comprising a Plurality of Passive Components In some implementations, providing/fabricating an interposer comprising a plurality of passive components includes several processes. FIG. 11 (which includes FIGS. 11A-11B) illustrates an exemplary sequence for providing/fabricating an interposer comprising a plurality of passive components. In some implementations, the sequence of FIGS. 11A-11B may be used to provide/fabricate the interposer of FIGS. 2-9 and/or other interposers described in the present disclosure. However, for the purpose of simplification, FIGS. 11A-11B will be described in the context of providing/fabricating the interposer 202 of FIG. 3.

It should be noted that the sequence of FIGS. 11A-11B may combine one or more stages in order to simplify and/or clarify the sequence for providing an interposer. In some implementations, the order of the processes may be changed or modified.

Stage 1, as shown in FIG. 11A, illustrates a state after a carrier 1100 and a lamination layer 1101 is provided. The lamination layer 1101 is provided over the carrier 1100. In some implementations, the lamination layer 1101 may be an adhesive layer.

Stage 2 illustrates a state after the first passive component 220, the second passive component 222, and the third passive component 224 are placed over the lamination layer 1101 and/or the carrier 1100. The first passive component 220, the second passive component 222, and the third passive component 224 may be placed using a pick and place tool.

Stage 3 illustrates a state after the encapsulation layer 300 is formed over the first passive component 220, the second passive component 222, and the third passive component 224. The encapsulation layer 300 may include a mold and/or an epoxy fill. In some implementations, the encapsulation layer 300 may be a litho-patternable layer. A litho-patternable layer/material that is a material that is photo etchable. That is, the litho-patternable layer/material is made of a material that can be etched and/or removed (e.g., through a lithography process) through the exposure of the material to a light source (e.g., ultraviolet (UV) light) through a mask (e.g., photomask). One advantage of a litho-patternable layer/material is that interconnects with lower pitch and/or spacing may be formed in the litho-patternable layer/material.

Stage 4 illustrates a state after the encapsulation layer 300, the first passive component 220, the second passive component 222, and the third passive component 224 are decoupled from the lamination layer 1101 and/or the carrier 1100.

Stage 5 illustrates a state after a portion of the encapsulation layer 300 is removed. In some implementations, a grinding process is used to remove a top portion of the encapsulation layer 300. In some implementations, the grinding process is an optional process.

Stage 6, as shown in FIG. 11B, illustrates a state after several cavities 1110 are formed in the encapsulation layer 300. Different implementations may use different processes for forming the cavities 1110. In some implementations, a laser process is used to form the cavities 1110. In some implementations, a photo-etching process is used to form the cavities 1110.

Stage 7 illustrates a state after one or more metal layers 1120 are formed. The one or more metal layers 1120 may include copper.

Stage 8 illustrates a state after the one or more metal layers 1120 are etched to form the plurality of interconnects 230 (e.g., interconnects 230*b*, 230*d*, 230*e*). In some implementations, a photo-etching process may be used to form the plurality of interconnects 230 from the one or more metal layers 1120. Stage 8 illustrates the interposer 202 that includes the encapsulation layer 300, the first passive component 220, the second passive component 222, the third passive component 224, and the plurality of interconnects 230.

Stage 9 illustrates a state after the plurality of first solder interconnects 217 and the plurality of second solder interconnects 219 are formed on the interposer 202. The plurality of first solder interconnects 217 and the plurality of second solder interconnects 219 are formed over the plurality of interconnects 230, the first passive component 220, the second passive component 222 and the third passive component 224. For example, the solder interconnect 217*b* is formed over the interconnect 230*b*, the solder interconnect 217*d* is formed over the interconnect 230*d*, the solder interconnect 217*e* is formed over the interconnect 230*e*, the solder interconnect 219*b* is formed over the first passive component 220, the solder interconnect 219*d* is formed over the interconnect 230*d*, and the solder interconnect 219*e* is formed over the second passive component 222.

In some implementations, the plurality of first solder interconnects 217 and the plurality of second solder interconnects 219 are formed using a solder printing process. In some implementations, the plurality of first solder interconnects 217 and the plurality of second solder interconnects 219 are solder paste.

Figure 12A:
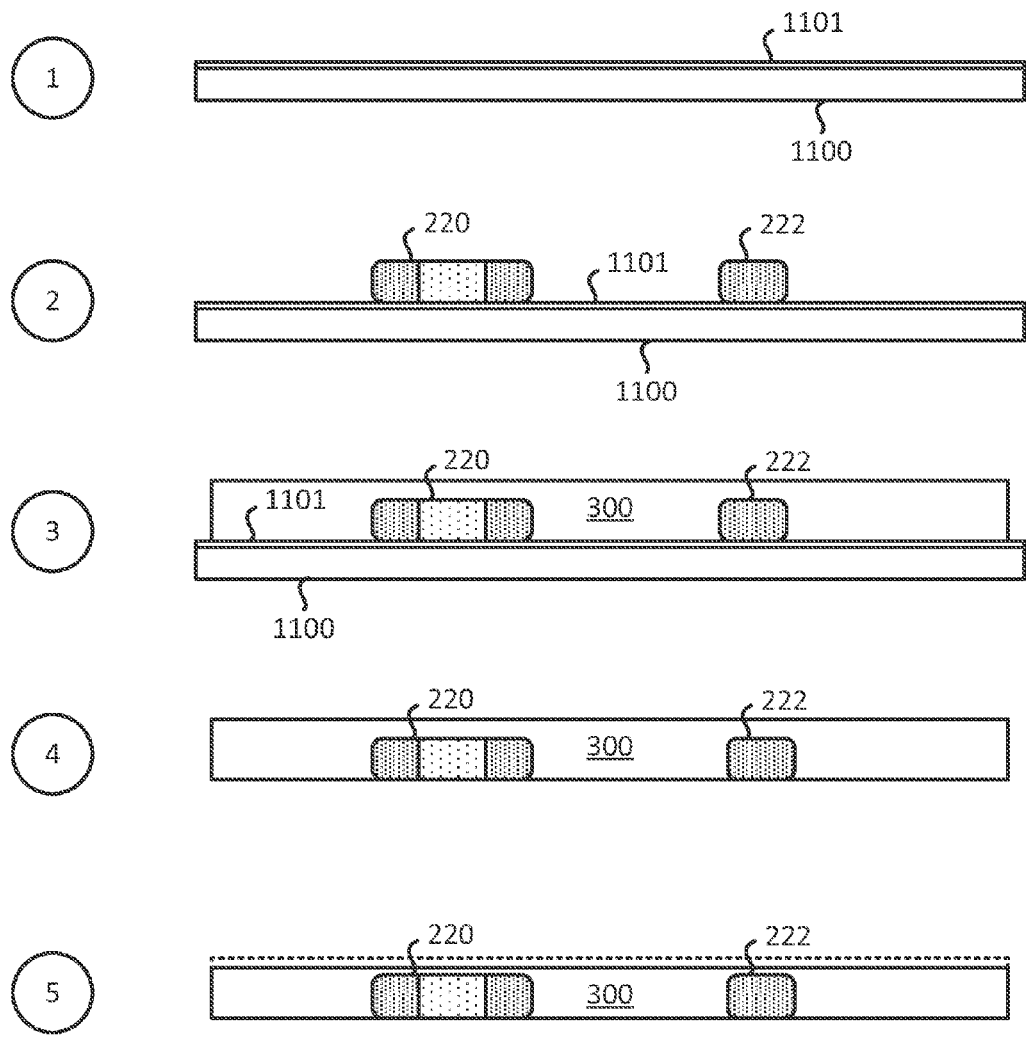
FIG. 12 (which comprises FIGS. 12A-12B) illustrates an example of a sequence for fabricating an interposer comprising passive components.
Figure 12B:
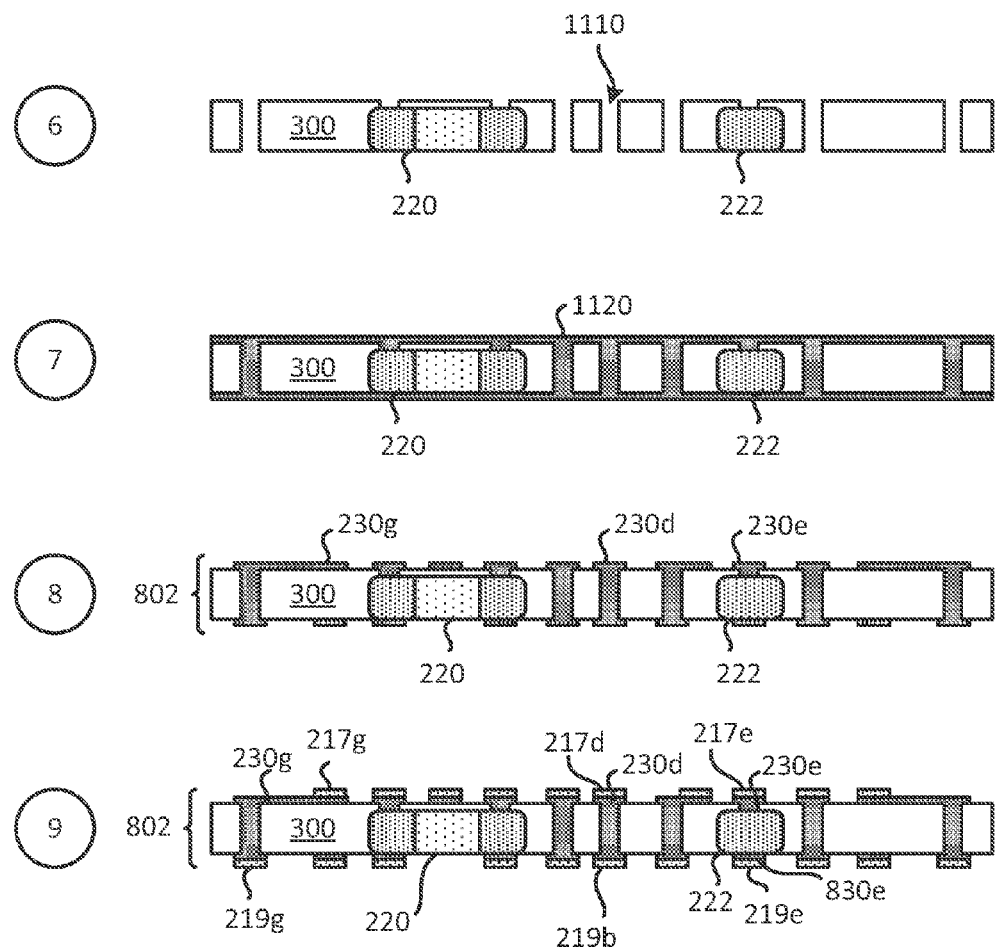

Exemplary Sequence for Fabricating an Interposer Comprising a Plurality of Passive Components In some implementations, providing/fabricating an interposer comprising a plurality of passive components includes several processes. FIG. 12 (which includes FIGS. 12A-12B) illustrates an exemplary sequence for providing/fabricating an interposer comprising a plurality of passive components. In some implementations, the sequence of FIGS. 12A-12B may be used to provide/fabricate the interposer of FIGS. 2-9 and/or other interposers described in the present disclosure. However, for the purpose of simplification, FIGS. 12A-12B will be described in the context of providing/fabricating the interposer 802 of FIG. 9.

It should be noted that the sequence of FIGS. 12A-12B may combine one or more stages in order to simplify and/or clarify the sequence for providing an interposer. In some implementations, the order of the processes may be changed or modified.

Stage 1, as shown in FIG. 12A, illustrates a state after a carrier 1100 and a lamination layer 1101 is provided. The lamination layer 1101 is provided over the carrier 1100. In some implementations, the lamination layer 1101 may be an adhesive layer.

Stage 2 illustrates a state after the first passive component 220 and the second passive component 222 are placed over the lamination layer 1101 and/or the carrier 1100. The first passive component 220 and the second passive component 222 may be placed using a pick and place tool.

Stage 3 illustrates a state after the encapsulation layer 300 is formed over the first passive component 220 and the second passive component 222. The encapsulation layer 300 may include a mold and/or an epoxy fill. In some implementations, the encapsulation layer 300 may be a litho-patternable layer. A litho-patternable layer/material that is a material that is photo etchable. That is, the litho-patternable layer/material is made of a material that can be etched and/or removed (e.g., through a lithography process) through the exposure of the material to a light source (e.g., ultraviolet (UV) light) through a mask (e.g., photomask). One advantage of a litho-patternable layer is that interconnects with lower pitch and/or spacing may be formed in the litho-patternable layer.

Stage 4 illustrates a state after the encapsulation layer 300, the first passive component 220 and the second passive component 222 are decoupled from the lamination layer 1101 and/or the carrier 1100.

Stage 5 illustrates a state after a portion of the encapsulation layer 300 is removed. In some implementations, a grinding process is used to remove a top portion of the encapsulation layer 300. In some implementations, the grinding process is an optional process.

Stage 6, as shown in FIG. 11B, illustrates a state after several cavities 1110 are formed in the encapsulation layer 300. Different implementations may use different processes for forming the cavities 1110. In some implementations, a laser process is used to form the cavities 1110. In some implementations, a photo-etching process is used to form the cavities 1110.

Stage 7 illustrates a state after one or more metal layers 1120 are formed. The one or more metal layers 1120 may include copper.

Stage 8 illustrates a state after the one or more metal layers 1120 are etched to form the plurality of interconnects 230 (e.g., interconnects 230d, 230e, 230g). In some implementations, a photo-etching process may be used to form the plurality of interconnects 230 from the one or more metal layers 1120. Stage 8 illustrates the interposer 802 that includes the encapsulation layer 300, the first passive component 220, the second passive component 222, the third passive component 224, and the plurality of interconnects 230.

Stage 9 illustrates a state after the plurality of first solder interconnects 217 and the plurality of second solder interconnects 219 are formed on the interposer 802. The plurality of first solder interconnects 217 and the plurality of second solder interconnects 219 are formed over the plurality of interconnects 230, the first passive component 220 and the second passive component 222. For example, the solder interconnect 217g is formed over the interconnect 230g, the solder interconnect 217d is formed over the interconnect 230d, the solder interconnect 217e is formed over the interconnect 230e, the solder interconnect 219g is formed over the interconnect 230g, the solder interconnect 219d is formed over the interconnect 230d, and the solder interconnect 219e is formed over the interconnect 830e.

In some implementations, the plurality of first solder interconnects 217 and the plurality of second solder interconnects 219 are formed using a solder printing process. In some implementations, the plurality of first solder interconnects 217 and the plurality of second solder interconnects 219 are solder paste.

Figure 13:
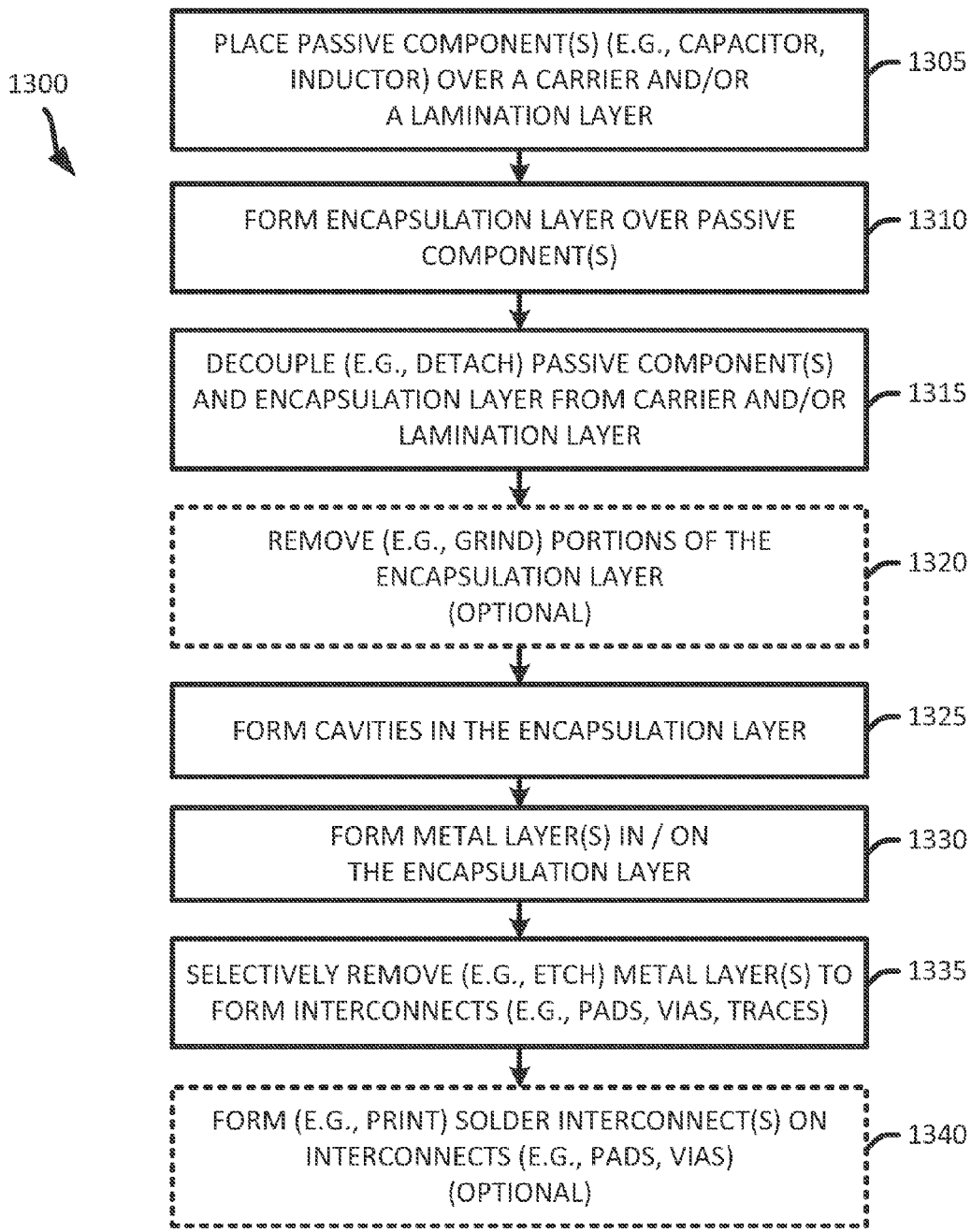
FIG. 13 illustrates a flow diagram of an exemplary method for fabricating an interposer comprising passive components.

Exemplary Method for Fabricating an Interposer Comprising a Plurality of Passive Components In some implementations, providing/fabricating an interposer comprising a plurality of passive components includes several processes. FIG. 13 illustrates an exemplary flow diagram of a method for providing/fabricating an interposer comprising a plurality of passive components. In some implementations, the method of FIG. 13 may be used to provide/fabricate the interposer of FIGS. 2-9 and/or other interposers described in the present disclosure. However, for the purpose of simplification, FIG. 13 will be described in the context of providing/fabricating the interposer 202 of FIG. 3.

It should be noted that the flow diagram of FIG. 13 may combine one or more processes in order to simplify and/or clarify the method for providing an interposer. In some implementations, the order of the processes may be changed or modified.

The method places (at 1305) at least one passive component (e.g., first passive component 220) over a carrier (e.g., carrier 1100) and/or a lamination layer (e.g., lamination layer 1101). In some implementations, the lamination layer may be an adhesive layer.

The method forms (at 1310) an encapsulation layer (e.g., encapsulation layer 300) over the at least one passive component. The encapsulation layer may include a mold and/or an epoxy fill. In some implementations, the encapsulation layer may be a litho-patternable layer. A litho-patternable layer/material that is a material that is photo etchable. That is, the litho-patternable layer/material is made of a material that can be etched and/or removed (e.g., through a lithography process) through the exposure of the material to a light source (e.g., ultraviolet (UV) light) through a mask (e.g., photomask).

The method decouples (at 1315) the encapsulation layer (e.g., encapsulation layer 300) and the at least one passive component (e.g., first passive component 220) from the lamination layer (e.g., lamination layer 1101) and/or the carrier (e.g., carrier 1100).

The method optionally removes (at 1320) a portion of the encapsulation layer (e.g., encapsulation layer 300). In some implementations, a grinding process is used to remove a top portion of the encapsulation layer.

The method forms (at 1325) a plurality of cavities 1110 in the encapsulation layer. Different implementations may use different processes for forming the plurality of cavities (e.g., cavities 1110). In some implementations, a laser process is used to form the cavities. In some implementations, a photo-etching process is used to form the cavities.

The method forms (at 1330) one or more metal layers (e.g., metal layers 1120) in/on the encapsulation layer. The metal layers may include copper.

The method selectively removes (at 1335) portions of the metal layer to form a plurality of interconnects (e.g., plurality of interconnects 230). In some implementations, a photo-etching process may be used to form the plurality of interconnects from the one or more metal layers.

The method forms (at 1340) a plurality of solder interconnects on the interposer. For example, the method may form (at 1340) the plurality of first solder interconnects 217 and the plurality of second solder interconnects 219 on the interposer 202 and/or the passive component. In some implementations, the plurality of solder interconnects are formed using a solder printing process. In some implementations, the plurality of solder interconnects are solder paste, in some implementations, the plurality of solder interconnects is optional to fabricate the interposer. In some implementations, the solder interconnects may be formed or provided during a later or earlier state of a fabrication process of an integrated circuit (IC) module (e.g., IC module 200).

Exemplary Sequence for Fabricating an Integrated Circuit (IC) Module Comprising an Interposer Comprising a Plurality of Passive Components In some implementations, providing/fabricating an integrated circuit (IC) module that includes an interposer comprising a plurality of passive components includes several processes.

Figure 14:
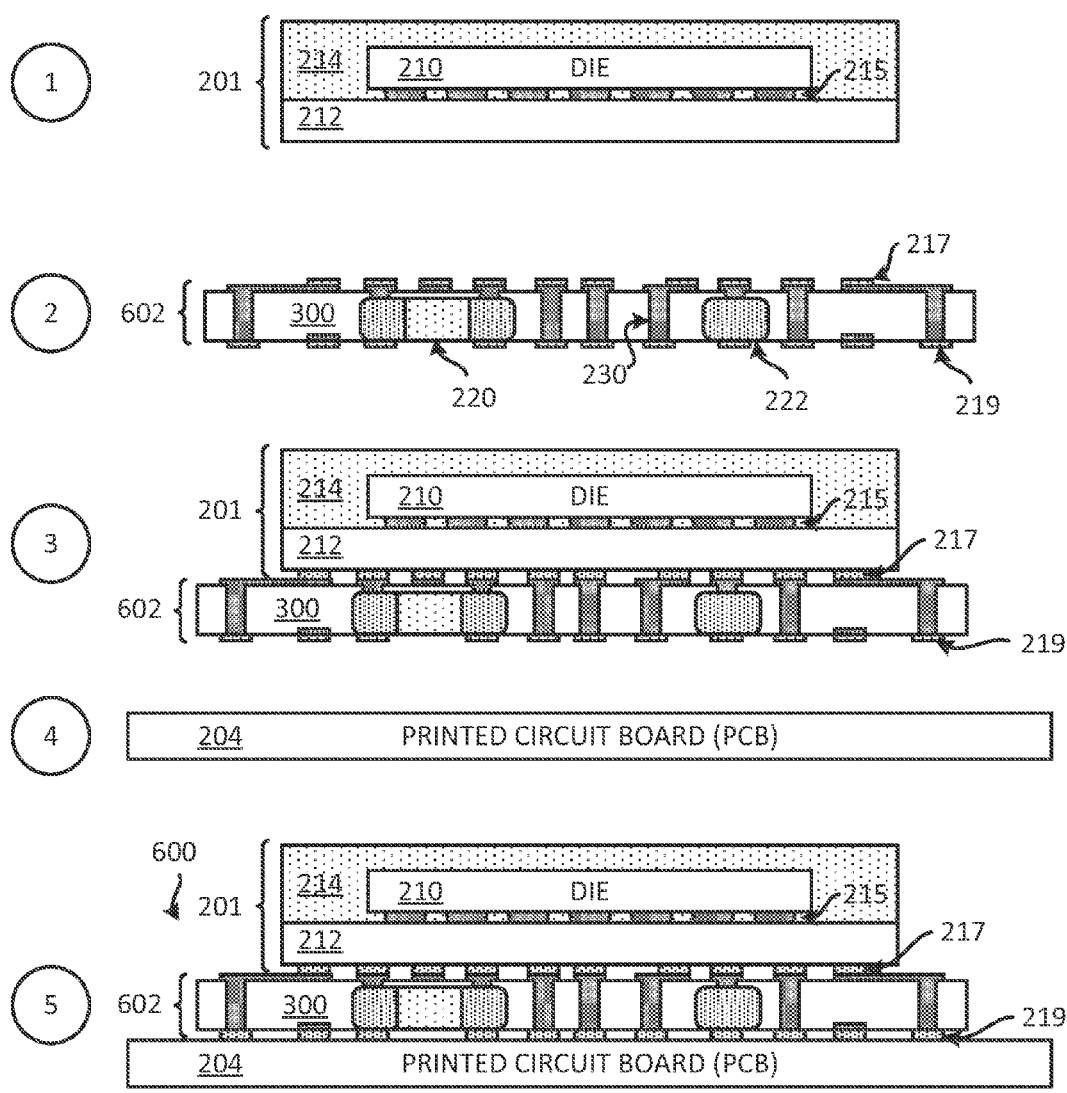
FIG. 14 illustrates an example of a sequence for fabricating a module that includes an integrated circuit (IC) package, an interposer comprising passive components, and a printed circuit board (PCB).
Figure 15:
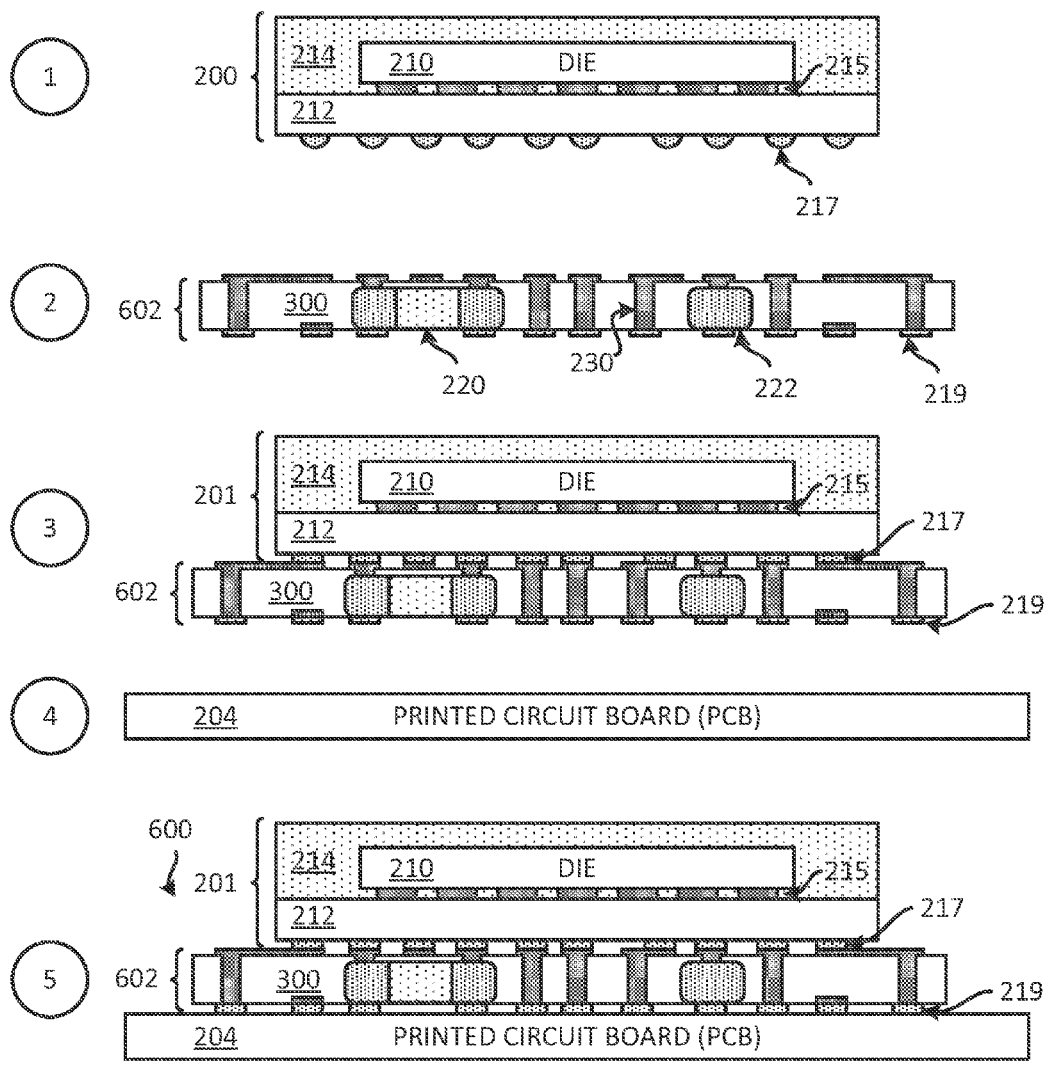
FIG. 15 illustrates an example of a sequence for fabricating a module that includes an integrated circuit (IC) package, an interposer comprising passive components, and a printed circuit board (PCB).
Figure 16:
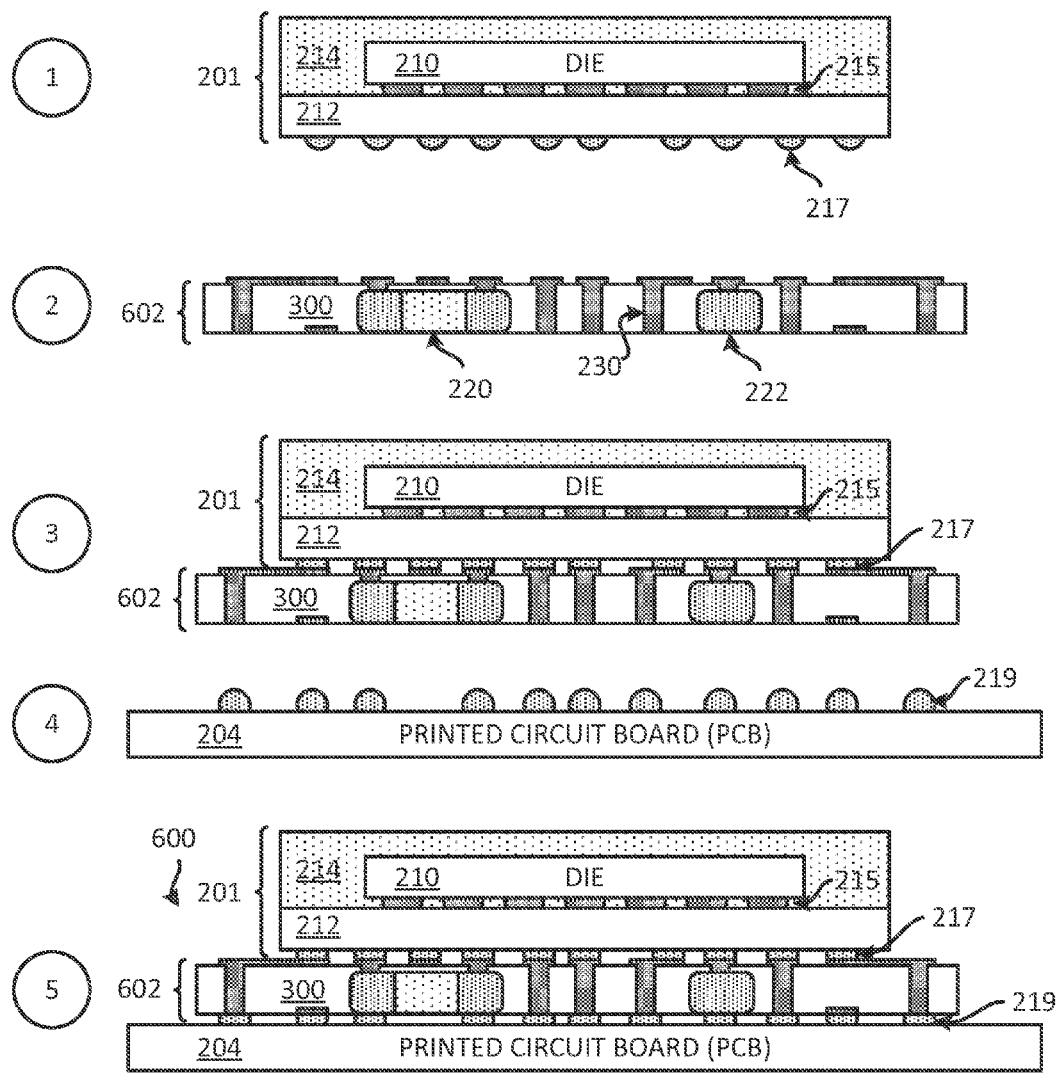
FIG. 16 illustrates an example of a sequence for fabricating a module that includes an integrated circuit (IC) package, an interposer comprising passive components, and a printed circuit board (PCB).

FIGS. 14-16 illustrate three exemplary sequences for fabricating an integrated circuit (IC) module that includes an interposer with at least one passive component. The main difference between the three exemplary sequences is when and how the solder interconnects (e.g., plurality of first solder interconnects 217, plurality of second solder interconnects 219) are formed during the fabrication process of the IC module. For all three sequences shown in FIGS. 14-16, the sequences will be described in the context of fabricating the integrated circuit (IC) module 600. However, the exemplary sequences shown in FIGS. 14-16 may be used to fabricate any of the IC modules described in the present disclosure.

FIG. 14 illustrates an exemplary sequence for providing/fabricating an integrated circuit (IC) module that includes an interposer with at least one passive component. In some implementations, the sequence of FIG. 14 may be used to provide/fabricate the integrated circuit (IC) module that includes an interposer with at least one passive component of FIGS. 2, 4, 6, 8 and/or other IC modules described in the present disclosure. However, for the purpose of simplification, FIG. 14 will be described in the context of providing/fabricating the IC module 600 of FIG. 6.

It should be noted that the sequence of FIG. 14 may combine one or more stages in order to simplify and/or clarify the sequence for providing an IC module. In some implementations, the order of the processes may be changed or modified.

Stage 1 illustrates a state after an integrated circuit (IC) package 201 is provided. The IC package 201 includes the die 210, the package substrate 212, the encapsulation layer 214, and the plurality of solder interconnects 215. The encapsulation layer 214 at least partially encapsulates the die 210.

Stage 2 illustrates a state after the interposer 602 is provided. The interposer 602 includes the encapsulation layer 300, the first passive component 220, the second passive component 222, and the plurality of interconnects 230. The interposer 602 also includes the plurality of first solder interconnects 217 and the plurality of second solder interconnects 219. In some implementations, the plurality of first solder interconnects 217 and the plurality of second solder interconnects 219 are formed using a solder printing process, in some implementations, the plurality of first solder interconnects 217 and the plurality of second solder interconnects 219 are solder paste.

Stage 3 illustrates a state after the IC package 201 is coupled to the interposer 602 through the plurality of first solder interconnects 217. In some implementations, stage 3 illustrates a state after a reflow process. The plurality of first solder interconnects 217 is coupled to the package substrate 212 of the IC package 201.

Stage 4 illustrates a state after a printed circuit board (PCB) 204 is provided.

Stage 5 illustrates a state after the IC package 201 and the interposer 602 is coupled to the PCB 204. As shown at stage 5, the interposer 602 is coupled to the PCB 204 through the plurality of second solder interconnects 219. In some implementations, stage 5 illustrates a state after a reflow process (e.g., second reflow process). In some implementations, stage 5 illustrates the integrated circuit (IC) module 600 that includes the IC package 201, the interposer 602 and the PCB 204.

FIG. 15 illustrates another exemplary sequence for providing/fabricating an integrated circuit (IC) module that includes an interposer with at least one passive component. In some implementations, the sequence of FIG. 15 may be used to provide/fabricate the integrated circuit (IC) module that includes an interposer with at least one passive component of FIGS. 2, 4, 6, 8 and/or other IC modules described in the present disclosure. However, for the purpose of simplification. FIG. 15 will be described in the context of providing/fabricating the IC module 600 of FIG. 6.

It should be noted that the sequence of FIG. 15 may combine one or more stages in order to simplify and/or clarify the sequence for providing an IC module. In some implementations, the order of the processes may be changed or modified.

Stage 1 illustrates a state after an integrated circuit (IC) package 201 is provided. The IC package 201 includes the die 210, the package substrate 212, the encapsulation layer 214, and the plurality of solder interconnects 215. The encapsulation layer 214 at least partially encapsulates the die 210. The IC package 201 also includes a plurality of first solder interconnects 217 (e.g., solder balls), which is coupled to the package substrate 212. In some implementations, the plurality of first solder interconnects 217 may be coupled to interconnects bumps (not shown) that are coupled to the package substrate 212.

Stage 2 illustrates a state after the interposer 602 is provided. The interposer 602 includes the encapsulation layer 300, the first passive component 220, the second passive component 222, and the plurality of interconnects 230. The interposer 602 also includes the plurality of second solder interconnects 219. Thus, the interposer 602 at stage 2 in FIG. 12 is different than the interposer 602 at stage 2 in FIG. 11, in that the interposer 602 at stage 2 in FIG. 12 does not include the plurality of first solder interconnects 217. However, it should be noted that the interposer 602 at stage 2 may include the plurality of first solder interconnects 217. In some implementations, the plurality of second solder interconnects 219 are formed using a solder printing process. In some implementations, the plurality of second solder interconnects 219 are solder paste.

Stage 3 illustrates a state after the IC package 201 is coupled to the interposer 602 through the plurality of first solder interconnects 217. In some implementations, stage 3 illustrates a state after a reflow process.

Stage 4 illustrates a state after a printed circuit board (PCB) 204 is provided.

Stage 5 illustrates a state after the IC package 201 and the interposer 602 is coupled to the PCB 204. As shown at stage 5, the interposer 602 is coupled to the PCB 204 through the plurality of second solder interconnects 219. In some implementations, stage 5 illustrates a state after a reflow process (e.g., second reflow process). In some implementations, stage 5 illustrates the integrated circuit (IC) module 600 that includes the IC package 201, the interposer 602 and the PCB 204.

FIG. 16 illustrates an exemplary sequence for providing/fabricating an integrated circuit (IC) module that includes an interposer with at least one passive component. In some implementations, the sequence of FIG. 16 may be used to provide/fabricate the integrated circuit (IC) module that includes an interposer with at least one passive component of FIGS. 2, 4, 6, 8 and/or other IC modules described in the present disclosure. However, for the purpose of simplification, FIG. 16 will be described in the context of providing/fabricating the IC module 600 of FIG. 6.

It should be noted that the sequence of FIG. 16 may combine one or more stages in order to simplify and/or clarify the sequence for providing an IC module. In some implementations, the order of the processes may be changed or modified.

Stage 1 illustrates a state after an integrated circuit (IC) package 201 is provided. The IC package 201 includes the die 210, the package substrate 212, the encapsulation layer 214, and the plurality of solder interconnects 215. The encapsulation layer 214 at least partially encapsulates the die 210. The IC package 201 also includes a plurality of first solder interconnects 217 (e.g., solder balls), which is coupled to the package substrate 212. In some implementations, the plurality of first solder interconnects 217 may be coupled to interconnects bumps (not shown) that are coupled to the package substrate 212.

Stage 2 illustrates a state after the interposer 602 is provided. The interposer 602 includes the encapsulation layer 300, the first passive component 220, the second passive component 222, and the plurality of interconnects 230.

Stage 3 illustrates a state after the IC package 201 is coupled to the interposer 602 through the plurality of first solder interconnects 217. In some implementations, stage 3 illustrates a state after a reflow process. The plurality of first solder interconnects 217 is coupled to the package substrate 212 of the IC package 201.

Stage 4 illustrates a state after a printed circuit board (PCB) 204 is provided. The PCB 204 also includes the plurality of second solder interconnects 219 (e.g., solder balls).

Stage 5 illustrates a state after the IC package 201 and the interposer 602 is coupled to the PCB 204. As shown at stage 5, the interposer 602 is coupled to the PCB 204 through the plurality of second solder interconnects 219. In some implementations, stage 5 illustrates a state after a reflow process (e.g., second reflow process). In some implementations, stage 5 illustrates the integrated circuit (IC) module 600 that includes the IC package 201, the interposer 602 and the PCB 204.

Exemplary Fan Out interposer Comprising Built-In Inductors

As mentioned above, in some implementations, an interposer may include a built-in inductor. In some implementations, a built-in inductor is an inductor comprising a plurality of first interconnects formed in/on the interposer. In some implementations, a built-in inductor may be more practical and/or cost effective than providing an off the shelf inductor (e.g., third passive component) in the interposer. For example, a built-in inductor can be formed in the interposer with a lower height than an off the shelf inductor. Moreover, a built-in inductor may be more customizable than an off the shelf inductor. In some implementations, a built-in inductor of an interposer is an inductor that is fabricated during the same fabrication process as the interposer. That is, a built-in inductor of an interposer may be an inductor that is fabricated as the interposer is being fabricated. In some implementations, an off the shelf inductor of an interposer, is an inductor that is fabricated using a separate fabrication process than the interposer, and is embedded in the interposer after the off the shelf inductor has been fabricated.

Figure 17:
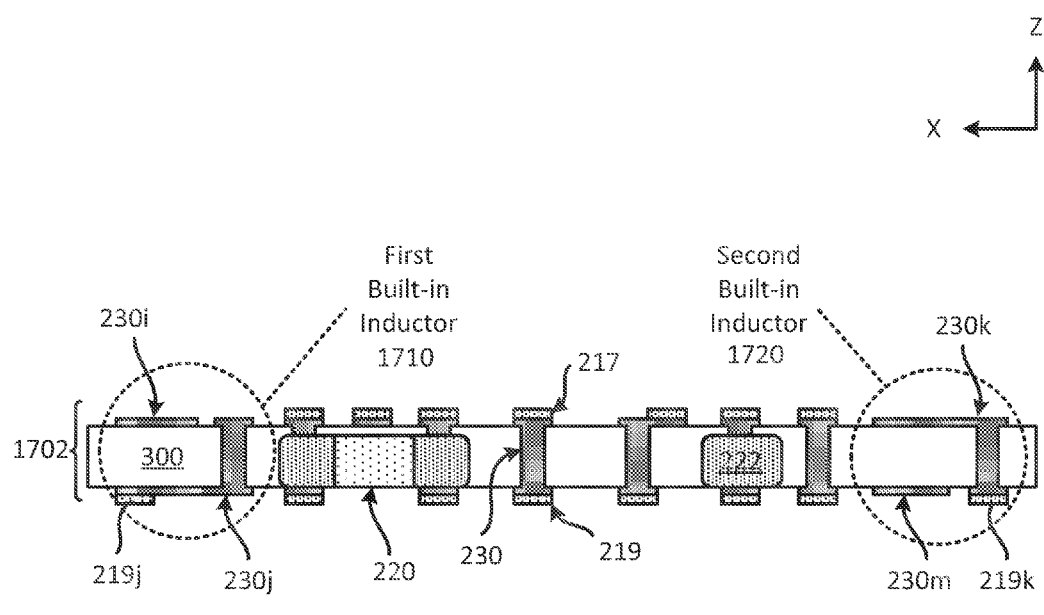
FIG. 17 illustrates a cross-sectional profile view of an interposer comprising a built-in inductor.

FIG. 17 illustrates a cross-sectional profile view of an interposer 1702 that includes a plurality of passive components and a plurality of built-in interposers. The interposer 1702 is similar to the interposer 802 of FIG. 9, except that some interconnects from the plurality of interconnects 230 and/or some interconnects from the plurality of interconnects 430, are formed and configured to operate as inductors (e.g., built inductors). The interposer 1702 may be implemented as part of any of the IC modules described in the present disclosure.

The interposer 1702 includes the encapsulation layer 300, the first passive component 220, the second passive component 222, the plurality of interconnects 230 (e.g., interconnects 230i-230m), the first inductor 1710, and the second inductor 1720, The first inductor 1710 includes a plurality of first interconnects (e.g., interconnect 230i, interconnect 230j). Thus, the interconnect 230i and the interconnect 230j are configured to operate as a first inductor 1710. The second inductor 1720 includes a plurality of second interconnects (e.g., interconnect 230k, interconnect 230m). Thus, the interconnect 230k and the interconnect 230m are configured to operate as a second inductor 1720. The first inductor 1710 and the second inductor 1720 may be built-in inductors.

The interconnect 230i may include a trace and a pad. The interconnect 230j may include a trace, a pad and a via. The interconnect 230i is formed at least on a first surface (e.g., top surface) of the encapsulation layer 300, and the interconnect 230j is formed at least on a second surface (e.g., bottom surface) of the encapsulation layer 300. The interconnect 230j may also be formed in the encapsulation layer 300 (e.g., as a via that traverses the encapsulation layer 300). Thus, a portion (e.g., trace, pad) of the interconnect 230j is on a surface of the encapsulation layer 300, and another portion (e.g., via) of the interconnect 230j traverses the encapsulation layer 300. A solder interconnect 219j is formed over the interconnect 230j.

The interconnect 230k may include a trace, a pad and a via. The interconnect 230m may include a trace and a pad. The interconnect 230k is formed at least on a first surface (e.g., top surface) of the encapsulation layer 300, and the interconnect 230m is formed at least on a second surface (e.g., bottom surface) of the encapsulation layer 300. The interconnect 230k may also be formed in the encapsulation layer 300 (e.g., as a via that traverses the encapsulation layer 300). Thus, a portion (e.g., trace, pad) of the interconnect 230k is on a surface of the encapsulation layer 300 and another portion (e.g., via) of the interconnect 230k traverses the encapsulation layer 300. A solder interconnect 219k is formed over the interconnect 230k.

Figure 18:
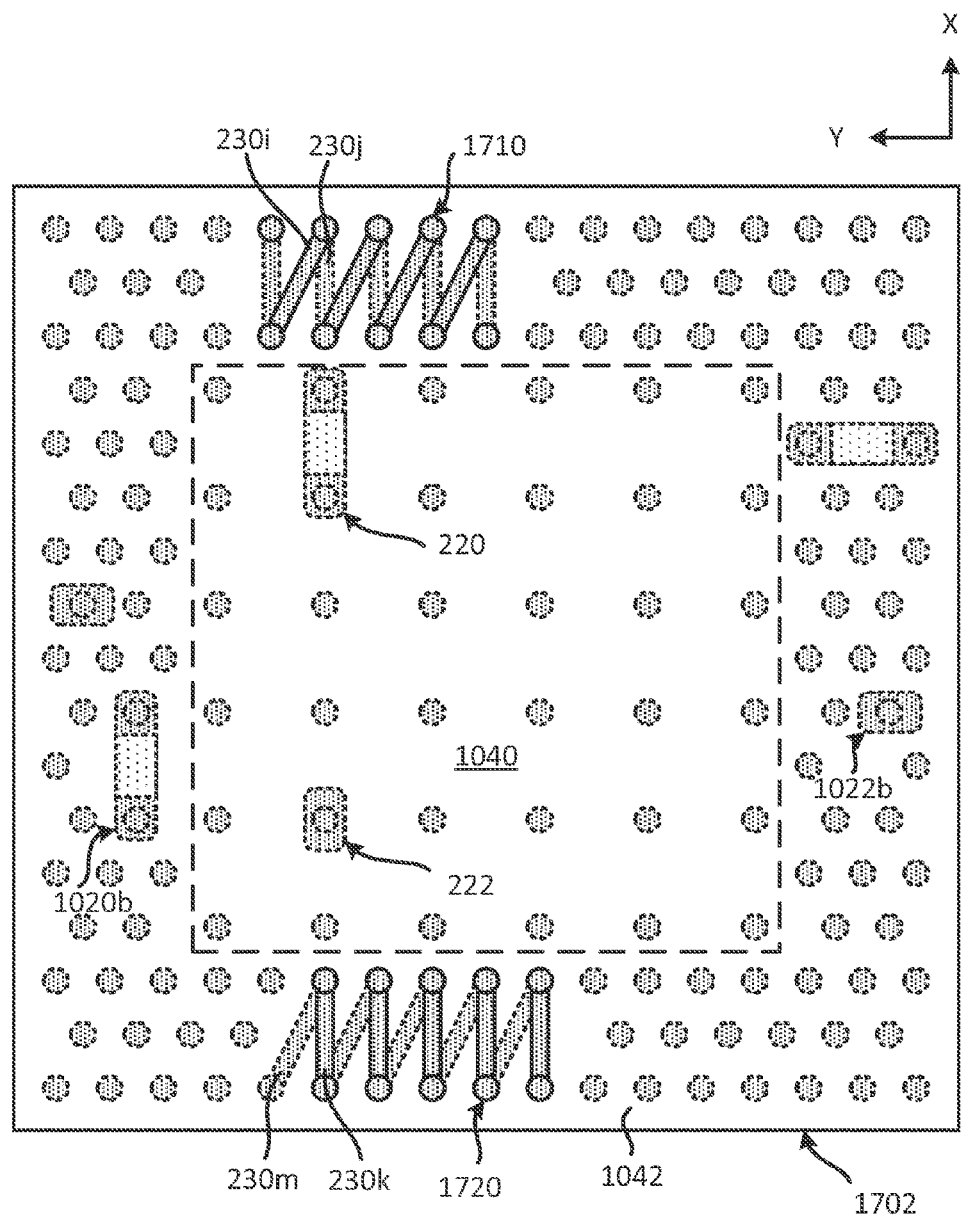
FIG. 18 illustrates a plan view of an interposer comprising a built-in inductor.

FIG. 18 illustrates a plan view (e.g., top view) of the interposer 1702. The interposer 1702 includes a first portion 1040 and a second portion 1042. The first passive component 220 and the second passive component 222 are located in the first portion 1040 of the interposer. The first inductor 1710 (e.g., first built-in inductor) and the second inductor 1720 (e.g., second built-in inductor) are located in the second portion 1042. However, the first inductor 1710 and the second inductor 1720 may be located in any portion of the interposer 1702. The first inductor 1710 includes a plurality of first interconnects (e.g., interconnect 230i, the interconnect 230j). The second inductor 1720 includes a plurality of second interconnects (e.g., interconnect 230k, interconnect 230m). As shown in FIG. 18, the first inductor 1710 and the second inductor 1720 may be configured to operate as solenoid inductors.

The first portion 1040 is a portion of the interposer 1702 that includes low density interconnects. The second portion 1042 is a portion of the interposer 1702 that includes high density interconnects. That is, the pitch and/or spacing of the interconnects (e.g., interconnect 230i) from the plurality of interconnects 230 in the second portion 1042, is greater than the pitch and/or spacing of the interconnects from the plurality of interconnects 230 in the first portion 1040. In some implementations, the second portion 1042 of the interposer 1002 is the fan out portion of the interposer 1002.

Exemplary Electronic Devices

Figure 19:
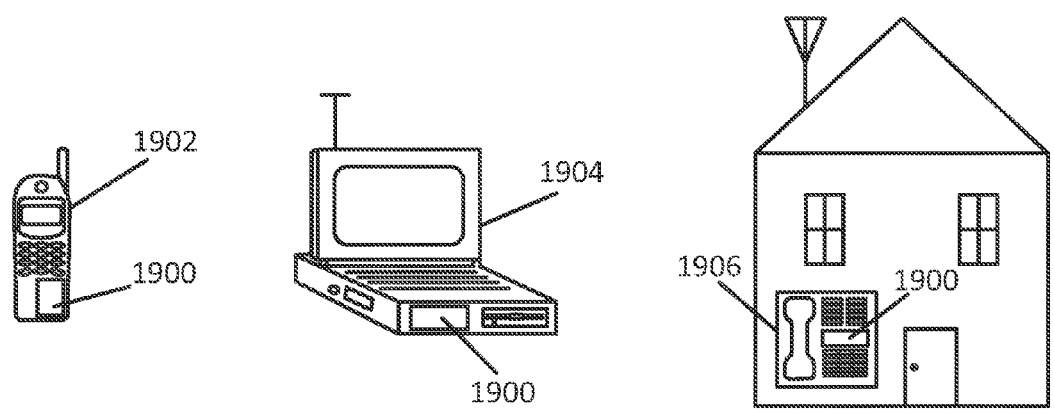
FIG. 19 illustrates various electronic devices that may include the various integrated circuit (IC) modules, interposer, integrated devices, integrated device packages, semiconductor devices, dies, integrated circuits, and/or packages described herein.

FIG. 19 illustrates various electronic devices that may be integrated with any of the aforementioned integrated device, semiconductor device, integrated circuit, die, interposer, package or package-on-package (PoP). For example, a mobile phone device 1902, a laptop computer device 1904, and a fixed location terminal device 1906 may include an integrated device 1900 as described herein. The integrated device 1900 may be, for example, any of the IC modules, interposer, integrated circuits, dies, integrated devices, integrated device packages, integrated circuit devices, device packages, integrated circuit (IC) packages, package-on-package devices described herein. The devices 1902, 1904, 1906 illustrated in FIG. 19 are merely exemplary. Other electronic devices may also feature the integrated device 1900 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2, 3, 4, 5, 6, 7, 8, 9, 10, 11A-11B, 12A-12B, 13, 14, 15, 16, 17, 18 and/or 19 may be rearranged and/or combined into a single component, process, feature or function or embodied in several components, processes, or functions. Additional elements, components, processes, and/or functions may also be added without departing from the disclosure, it should also be noted that FIGS. 2, 3, 4, 5, 6, 7, 8, 9, 10, 11A-11B, 12A-12B, 13, 14, 15, 16, 17, 18 and/or 19 and its corresponding description in the present disclosure is not limited to dies and/or ICs. In some implementations, FIGS. 2, 3, 4, 5, 6, 7, 8, 9, 10, 11A-11B, 12A-12B, 13, 14, 15, 16, 17, 18 and/or 19 and its corresponding description may be used to manufacture, create, provide, and/or produce integrated devices. In some implementations, a device may include an IC module, a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A device comprising:
   a die;
   a substrate coupled to the die; and
   an interposer coupled to the substrate such that the die is located externally of the interposer, the interposer comprising:
   an encapsulation layer formed entirely by a single layer, the encapsulation layer comprising a first outer surface and a second outer surface, wherein the second outer surface is opposite to the first outer surface, the first outer surface of the encapsulation layer defines a first interposer outer surface, and the second outer surface of the encapsulation layer defines a second interposer outer surface;
   at least one via extending through the entirety of the encapsulation layer;
   a first passive component located externally of the die, the first passive component at least partially embedded in the encapsulation layer such that the first passive component is co-planar to the at least one via that extends through the entirety of the encapsulation layer,
   wherein a surface of the first passive component is co-planar to the first outer surface of the encapsulation layer,
   wherein the first passive component is configured such that an electrical signal travels between the first outer surface of the encapsulation layer and the second outer surface of the encapsulation layer, through the first passive component;
   a second passive component located externally of the die, the second passive component at least partially embedded in the encapsulation layer such that the second passive component is co-planar to the at least one via that extends through the entirety of the encapsulation layer,
   wherein the first passive component and the second passive component are located in the encapsulation layer such that the first passive component and the second passive component are offset towards the first outer surface of the encapsulation layer; and
   plurality of interconnects at least partially formed in the encapsulation layer,
   wherein at least one interconnect from the plurality of interconnects is coupled to the first passive component and
   wherein at least one other interconnect from the plurality of interconnects is coupled to the second passive component; and
   a plurality of first solder interconnects coupled to the plurality of interconnects.

2. The device of claim 1, wherein the encapsulation layer comprises an E-glass, a mold and/or an epoxy fill.

3. The device of claim 1, wherein the encapsulation layer comprises a photo litho-patternable layer.

4. The device of claim 1, further comprising:
   a plurality of second solder interconnects coupled to the interposer,
   wherein at least one solder interconnect from the plurality of second solder interconnects is coupled to the first passive component, and
   wherein at least one other solder interconnect from the plurality of second solder interconnects is coupled to the second passive component.

5. The device of claim 1, further comprising a pad coupled to the first passive component, wherein at least one solder interconnect from the second solder interconnect is coupled to the pad.

6. The device of claim 1, wherein the interposer is a fan out interposer comprising:
a first portion comprising a plurality of first interconnects comprising a first minimum pitch; and
a second portion comprising a plurality of second interconnects comprising a second minimum pitch.

7. The device of claim 6, wherein the second minimum pitch is less than the first minimum pitch.

8. The device of claim 1, further comprising an inductor formed by a plurality of first interconnects.

9. The device of claim 1, wherein the first passive component comprises a capacitor or an inductor.

10. The device of claim 1, wherein the first passive component is part of an electronic voltage regulator (EVR).

11. The device of claim 1, wherein the device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and further including the device.

12. A device comprising: an integrated circuit (IC) package;
a plurality of first solder interconnects coupled to the IC package;
an interposer coupled to the IC package through the plurality of first solder interconnects such that the IC package is located externally of the interposer, the interposer comprising:
an encapsulation layer formed entirely by a single layer, the encapsulation layer comprising a first outer surface and a second outer surface, wherein the second outer surface is opposite to the first outer surface, the first outer surface of the encapsulation layer defines a first interposer outer surface, and the second outer surface of the encapsulation layer defines a second interposer outer surface;
at least one via extending through the entirety of the encapsulation layer;
a first passive component at least partially embedded in the encapsulation layer such that the first passive component is co-planar to the at least one via that extends through the entirety of the encapsulation layer, wherein a surface of the first passive component is co-planar to the first outer surface of the encapsulation layer, wherein the first passive component is configured such that an electrical signal travels between the first outer surface of the encapsulation layer and the second outer surface of the encapsulation layer, through the first passive component;
a second passive component at least partially embedded in the encapsulation layer such that the second passive component is co-planar to the at least one via that extends through the entirety of the encapsulation layer, wherein the first passive component and the second passive component are located in the encapsulation layer such that the first passive component and the second passive component are offset towards the first outer surface of the encapsulation layer;
a plurality of interconnects coupled to the plurality of first solder interconnects, wherein the plurality of interconnects is at least partially formed in the encapsulation layer;
wherein at least one interconnect from the plurality of interconnects is coupled to the first passive component, and
wherein at least one other interconnect from the plurality of interconnects is coupled to the second passive component;
a plurality of second solder interconnects coupled to the interposer; and
a printed circuit board (PCB) coupled to the interposer through the plurality of second solder interconnects.

13. The device of claim 12, wherein the encapsulation layer comprises an E-glass, a mold and/or an epoxy fill.

14. The device of claim 12, wherein the encapsulation layer comprises a photo litho-patternable layer.

15. The device of claim 12, wherein the interposer further comprises an inductor formed by a plurality of first interconnects.

16. The device of claim 12, further comprising:
wherein at least one second solder interconnect from the plurality of second solder interconnects is coupled to the first passive component, and
wherein at least one other solder interconnect from the plurality of second solder interconnects is coupled to the second passive component.

17. The device of claim 12, wherein the interposer is a fan out interposer comprising:
a first portion comprising a plurality of first interconnects comprising a first minimum pitch; and
a second portion comprising a plurality of second interconnects comprising a second minimum pitch.

18. The device of claim 12, wherein the first passive component comprises a capacitor or an inductor.

19. The device of claim 12, wherein the device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and further including the device.

20. The device of claim 12, wherein the integrated circuit (IC) package comprises a die and a package substrate.

21. The device of claim 20, wherein the integrated circuit (IC) package further comprises another encapsulation layer.

22. The device of claim 12, wherein the surface of the first passive component faces the PCB, and the surface of the first passive component is co-planar to a surface of the encapsulation layer that faces the PCB.

23. The device of claim 12, wherein the first passive component comprises a height that is similar to a thickness of the encapsulation layer.

24. The device of claim 12, wherein the interposer comprises a thickness that is in a range of about 130-270 micrometers (μm).

25. The device of claim 12, wherein the interposer comprises a thickness that is in a range of about 130-170 micrometers (μm), and the first passive component comprises a thickness that is less than 100 micrometers (μm).

26. The device of claim 12, wherein the interposer comprises a thickness that is in a range of about 140-270 micrometers (μm), and the first passive component comprises a thickness that is in a range of about 110-150 micrometers (μm).

\* \* \* \* \*